(12) United States Patent
Yamada

(10) Patent No.: US 11,029,779 B2
(45) Date of Patent: Jun. 8, 2021

(54) CAPACITIVE SENSOR AND INPUT DEVICE

(71) Applicant: ALPS ALPINE CO., LTD., Tokyo (JP)

(72) Inventor: Tomoki Yamada, Miyagi-ken (JP)

(73) Assignee: CAPITAL ONE SERVICES, LLC, McLean, VA (US)

(*) Notice: Subject to any disclaimer, the term of this patent is extended or adjusted under 35 U.S.C. 154(b) by 0 days.

(21) Appl. No.: 16/534,271

(22) Filed: Aug. 7, 2019

(65) Prior Publication Data

US 2019/0361548 A1   Nov. 28, 2019

Related U.S. Application Data

(63) Continuation of application No. PCT/JP2017/047324, filed on Dec. 28, 2017.

(30) Foreign Application Priority Data

Feb. 16, 2017 (JP) .............................. JP2017-027349

(51) Int. Cl.
*G06F 3/044* (2006.01)
*G06F 3/041* (2006.01)
*H03K 17/955* (2006.01)

(52) U.S. Cl.
CPC ........ *G06F 3/04164* (2019.05); *G06F 3/0412* (2013.01); *G06F 3/0443* (2019.05); *G06F 3/0448* (2019.05); *G06F 3/04166* (2019.05); *H03K 17/955* (2013.01)

(58) Field of Classification Search
CPC ...... G06F 3/041; G06F 3/0412; G06F 3/0416; G06F 3/044; H03K 17/955

USPC .................................................. 345/173–174
See application file for complete search history.

(56) References Cited

U.S. PATENT DOCUMENTS

| | | | |
|---|---|---|---|
| 2008/0150906 A1 | 6/2008 | Grivna | |
| 2013/0300677 A1 | 11/2013 | Kim et al. | |
| 2015/0138104 A1 | 5/2015 | Sugita | |
| 2015/0179122 A1 | 6/2015 | Brown et al. | |
| 2015/0205405 A1* | 7/2015 | Yumoto | G06F 3/044 345/174 |
| 2015/0206501 A1* | 7/2015 | Kurasawa | G02F 1/13338 345/206 |
| 2016/0266709 A1* | 9/2016 | Kurasawa | G06F 3/0448 |
| 2016/0291759 A1* | 10/2016 | Kurasawa | G06F 3/04166 |

(Continued)

*Primary Examiner* — Kwin Xie
(74) *Attorney, Agent, or Firm* — Hunton Andrews Kurth LLP

(57) ABSTRACT

Three or more detection electrodes intersect in each of sections that divide a region to which an object is approachable. The detection electrodes each include partial electrodes connected in cascade via wiring, and partial electrodes included in the detection electrodes that intersect in each section are disposed in the section. Three or more partial electrodes disposed in the section includes a single first partial electrode and at least two second partial electrodes. The first partial electrode is connected in cascade to the partial electrode on one side through a first-layer or second-layer wiring and to the partial electrode on the other side through the second-layer wiring. Each second partial electrode is connected in cascade to the partial electrode in one side through the first-layer wiring and to the partial electrode on the other side through the second-layer wiring.

14 Claims, 35 Drawing Sheets

(56) References Cited

U.S. PATENT DOCUMENTS

2017/0102804 A1    4/2017   Kikukawa et al.
2017/0139544 A1    5/2017   Yamada
2017/0322647 A1   11/2017   Katsuhara et al.
2017/0371470 A1*  12/2017   Nathan ................ G06F 3/0414

* cited by examiner

FIG. 5A
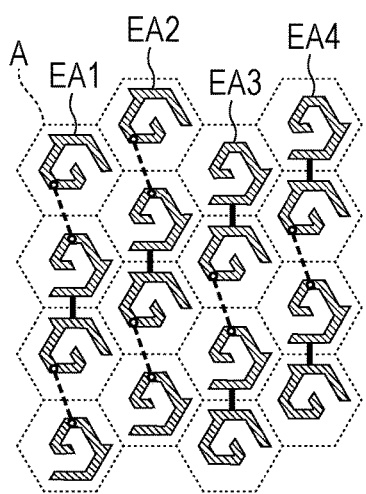
FIG. 5B
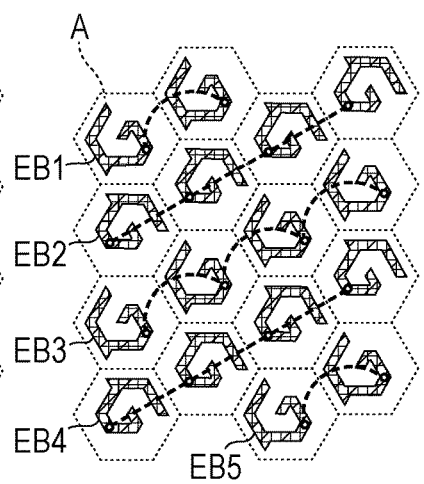
FIG. 5C
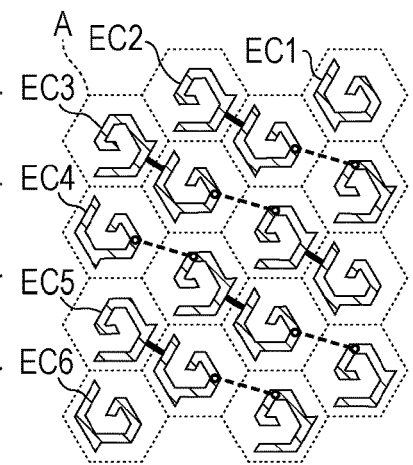
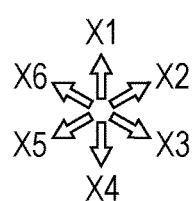
| — | FIRST-LAYER WIRE |
| --- | --- |
| ---- | SECOND-LAYER WIRE |
| ○ | VIA |

FIG. 6A
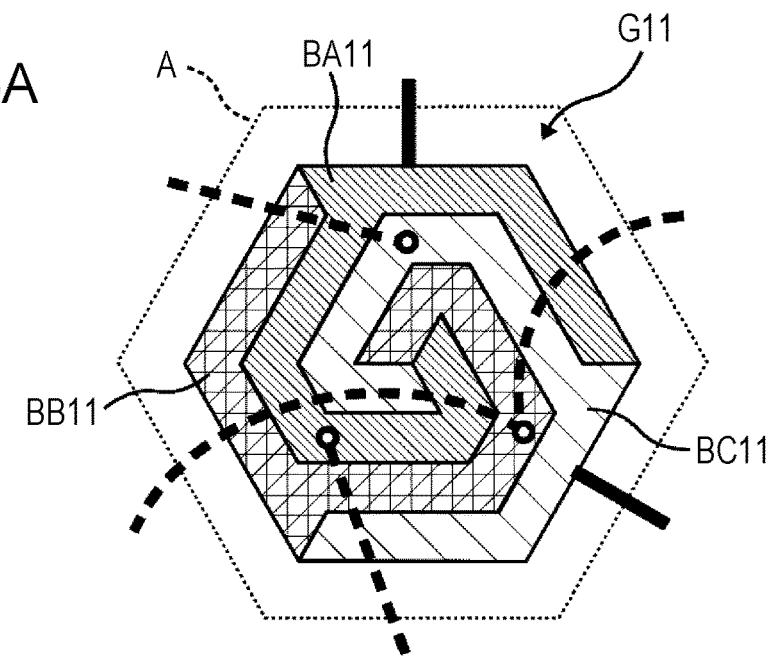
FIG. 6B
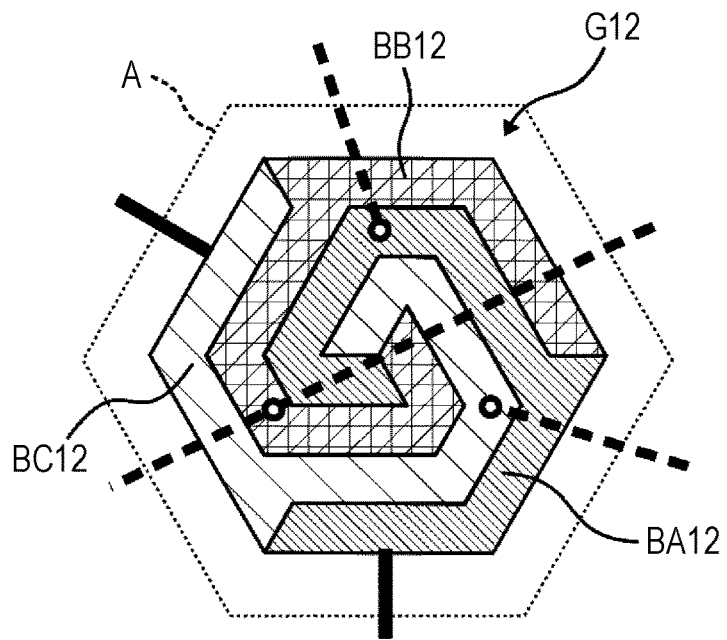
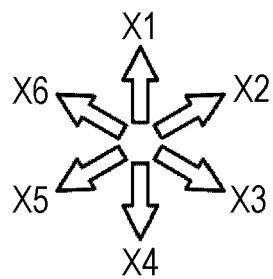
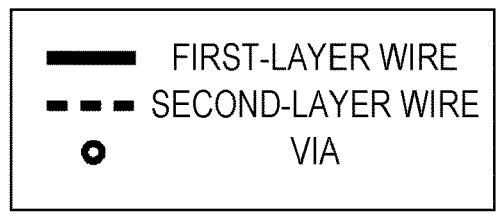

FIG. 8A
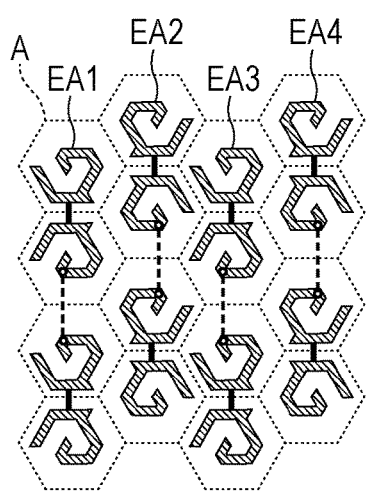
FIG. 8B
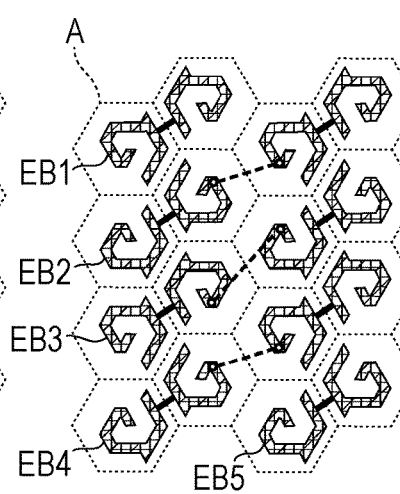
FIG. 8C
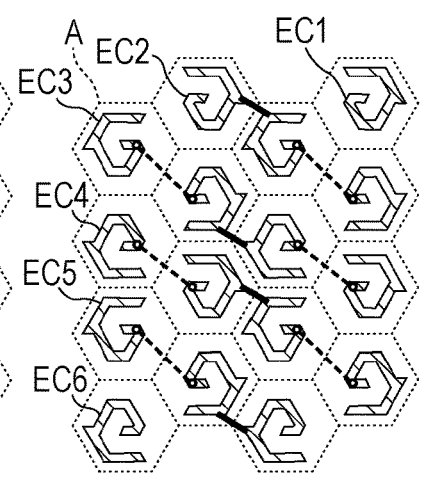
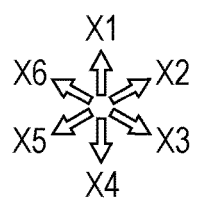

FIG. 9A
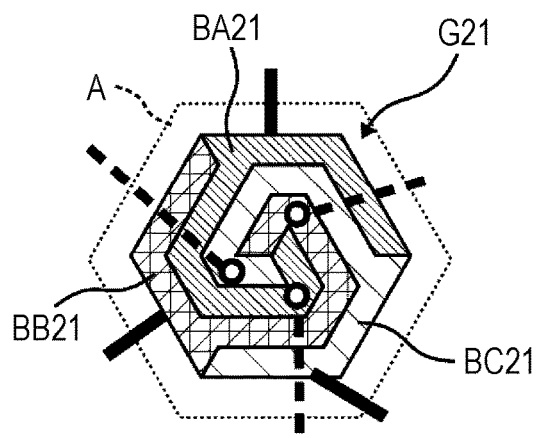
FIG. 9B
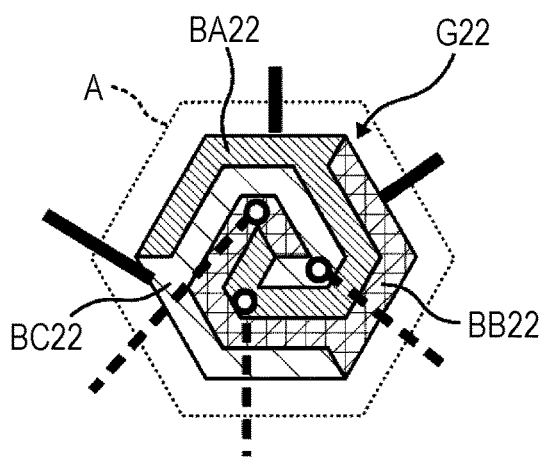
FIG. 9C
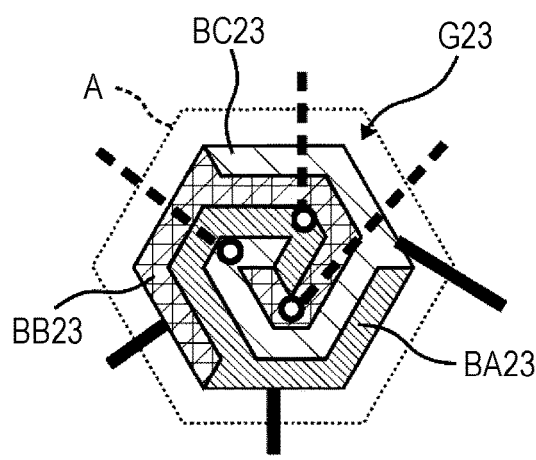
FIG. 9D
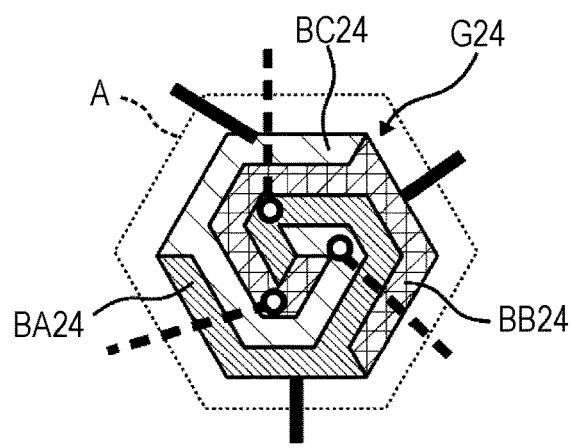
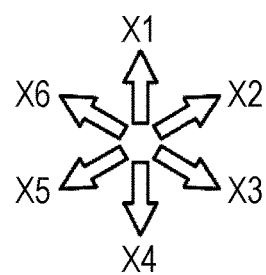
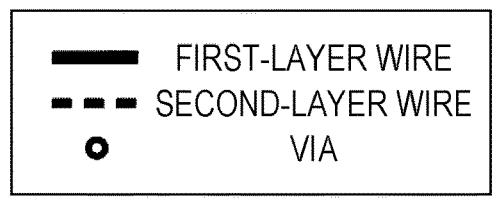

FIG. 11A
FIG. 11B
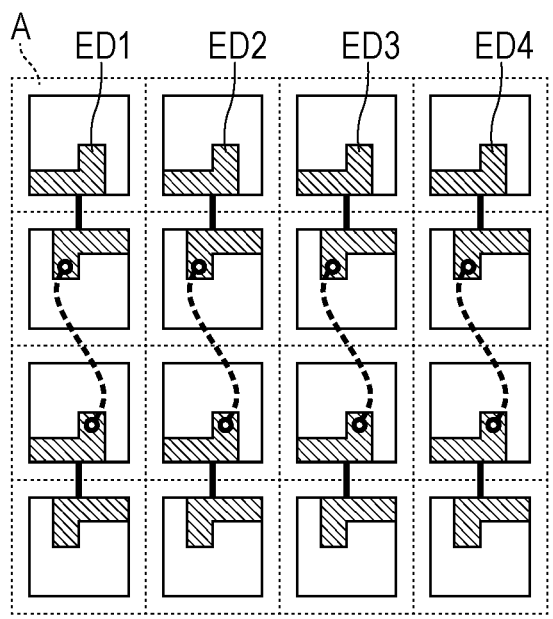
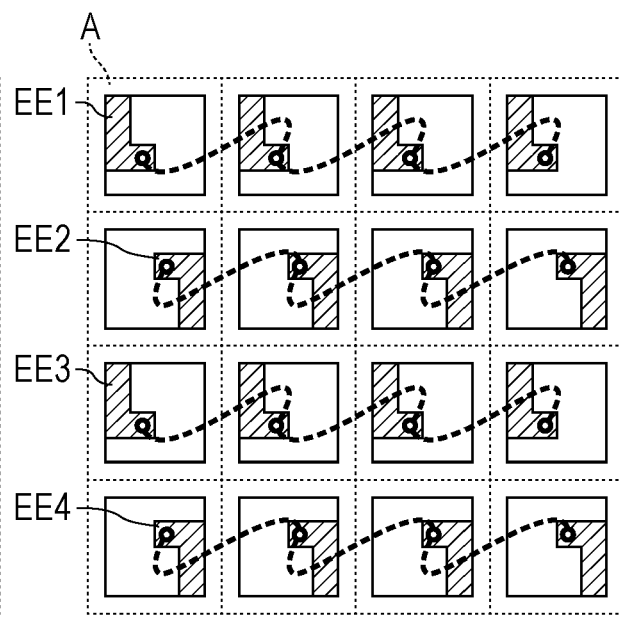
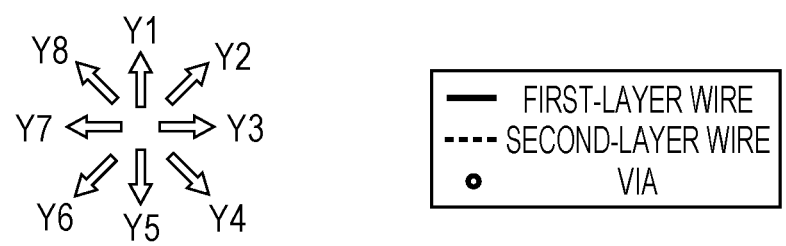

FIG. 12A
FIG. 12B
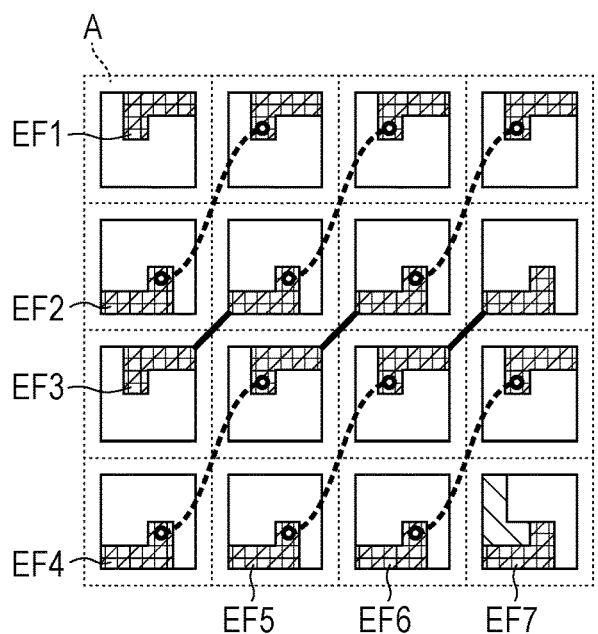
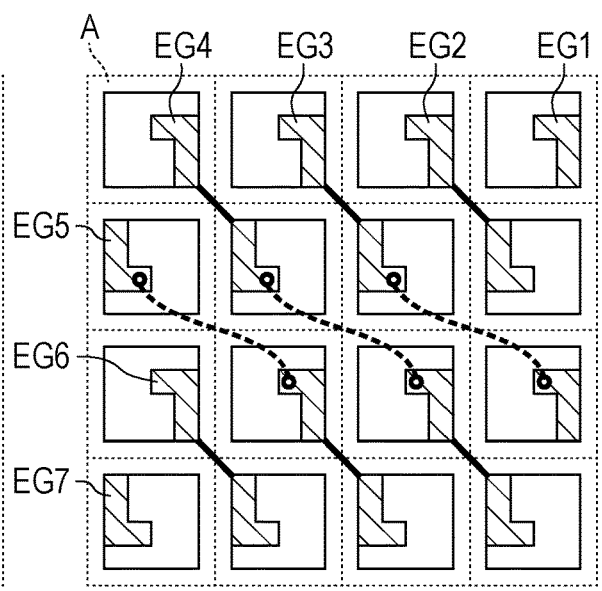
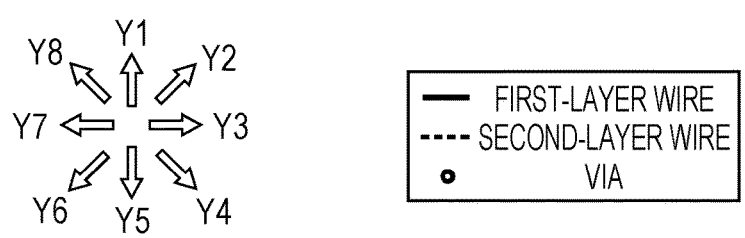

FIG. 13A
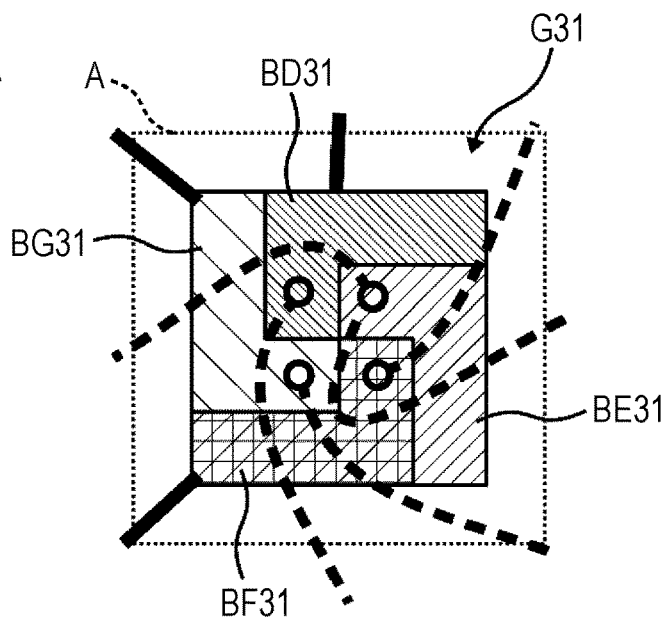
FIG. 13B
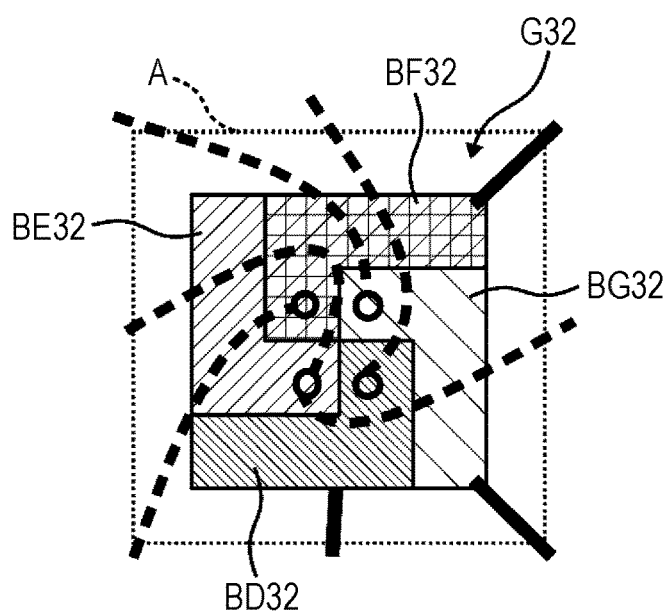
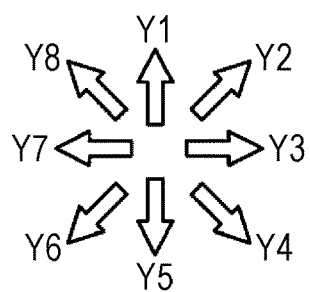
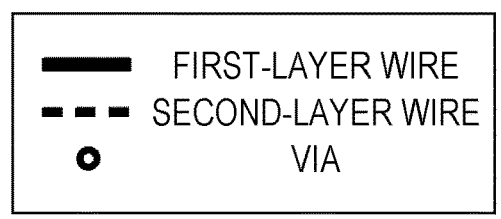

FIG. 15A
FIG. 15B
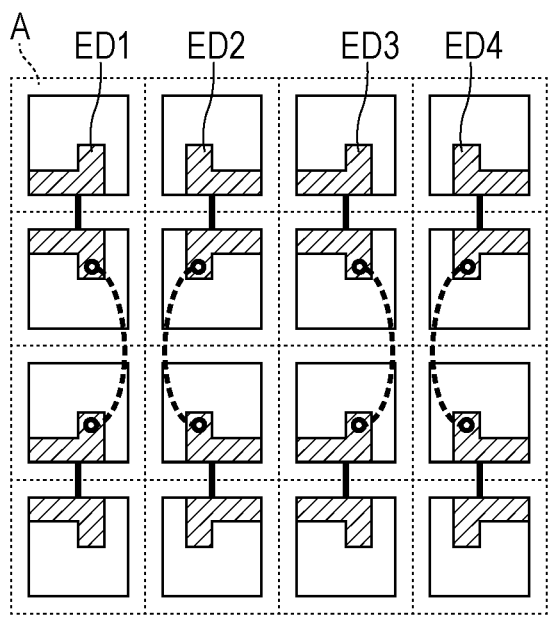
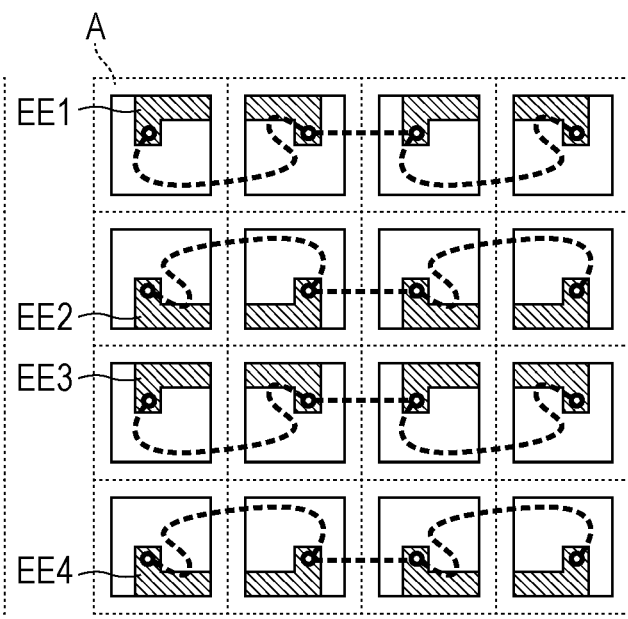
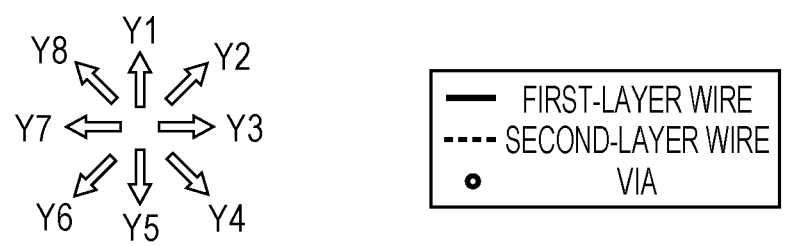

FIG. 16A
FIG. 16B
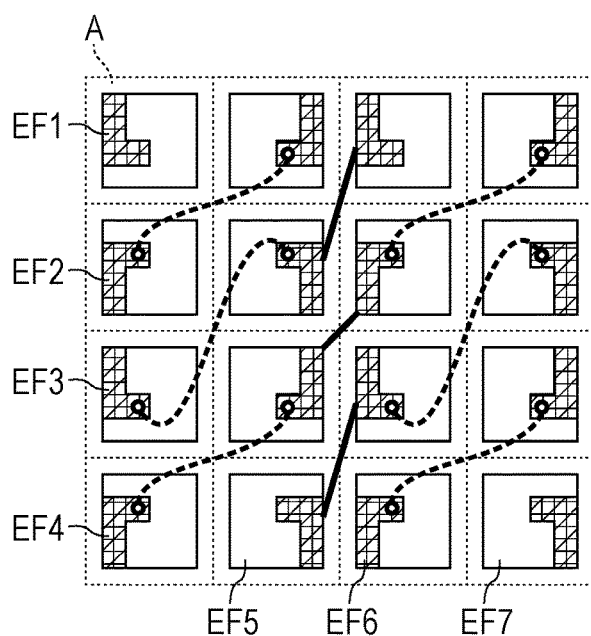
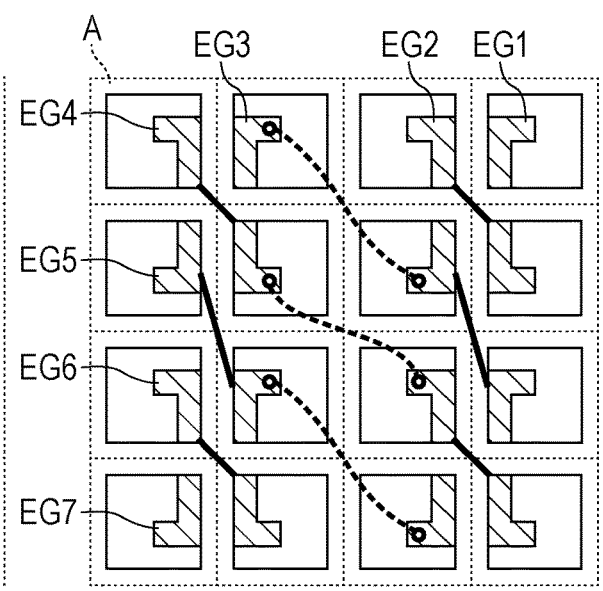
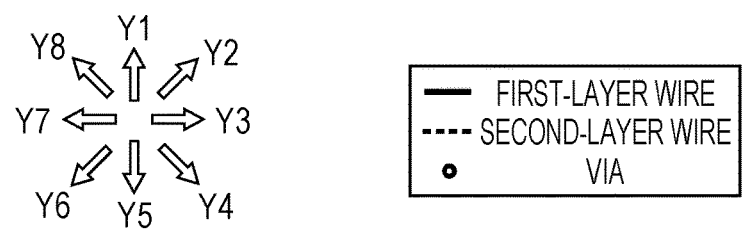

FIG. 17A
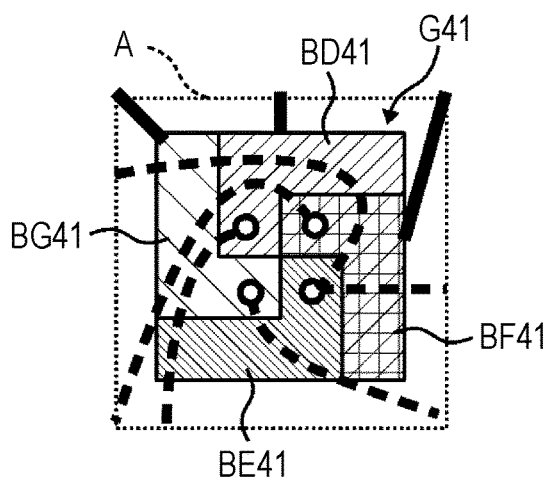
FIG. 17B
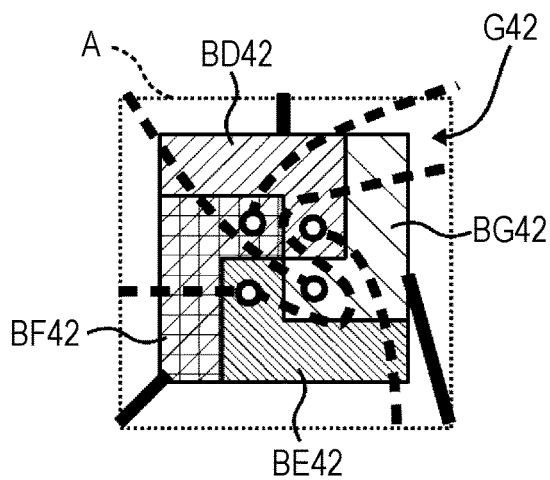
FIG. 17C
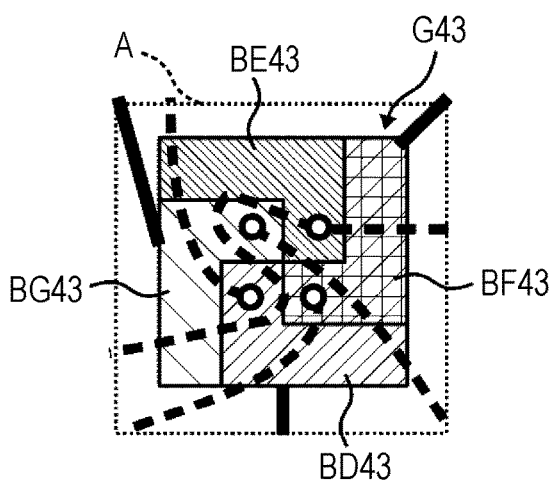
FIG. 17D
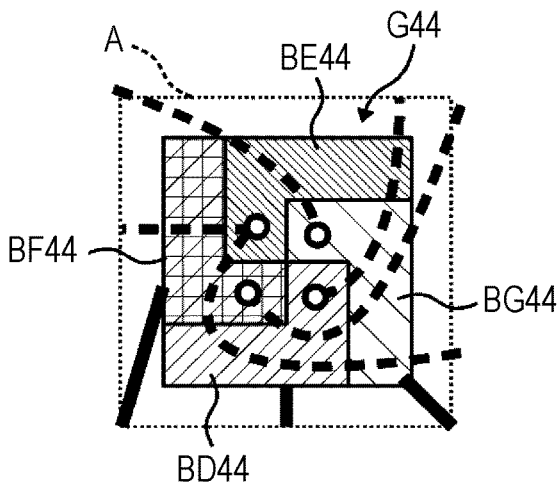
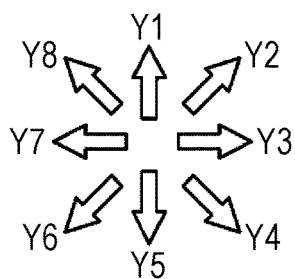

FIG. 19
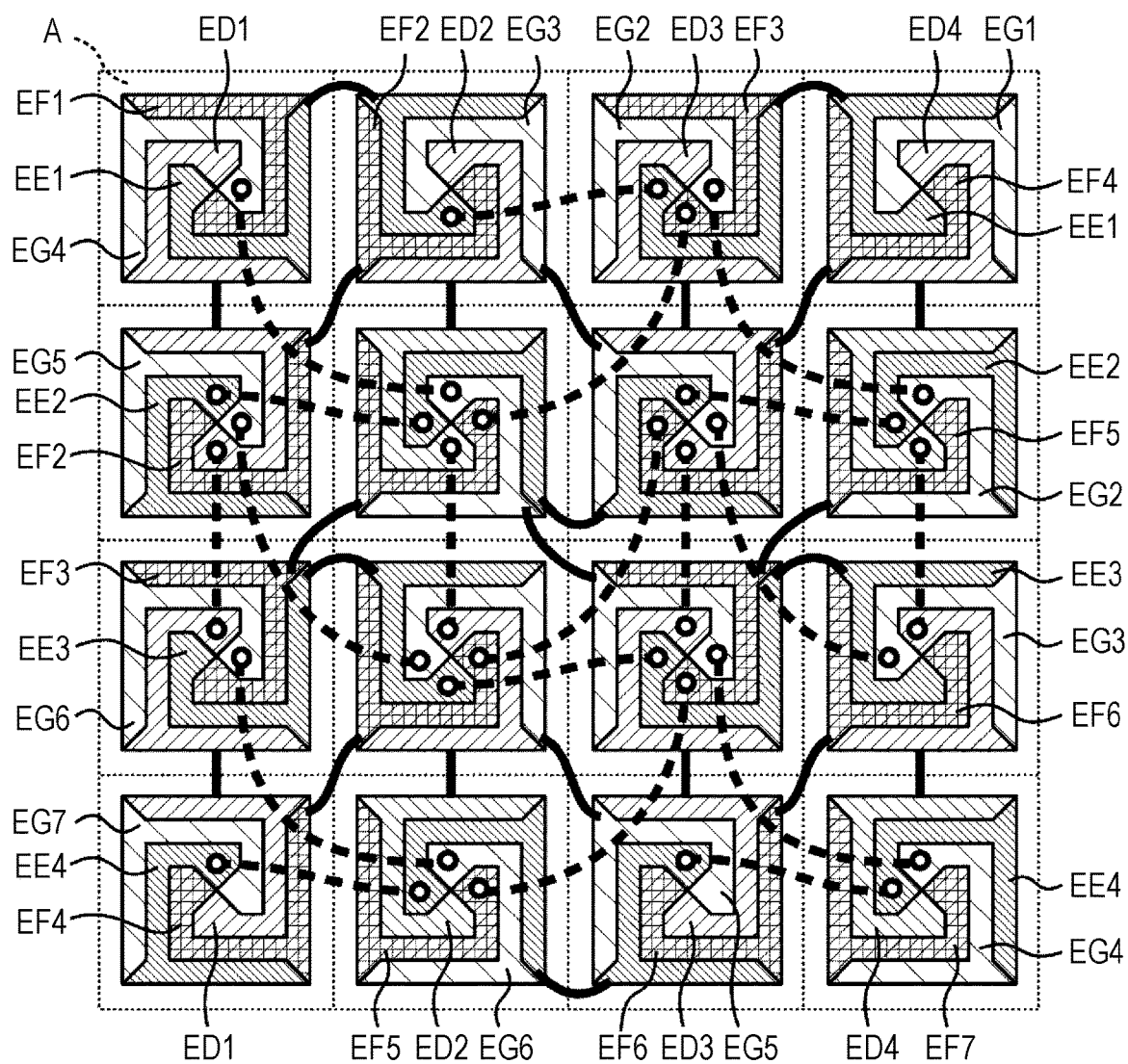
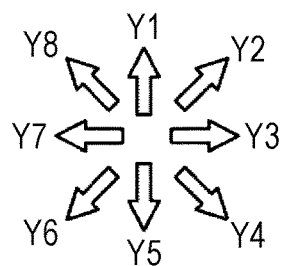
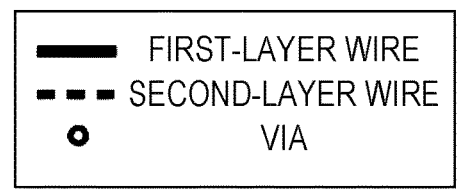

FIG. 20A
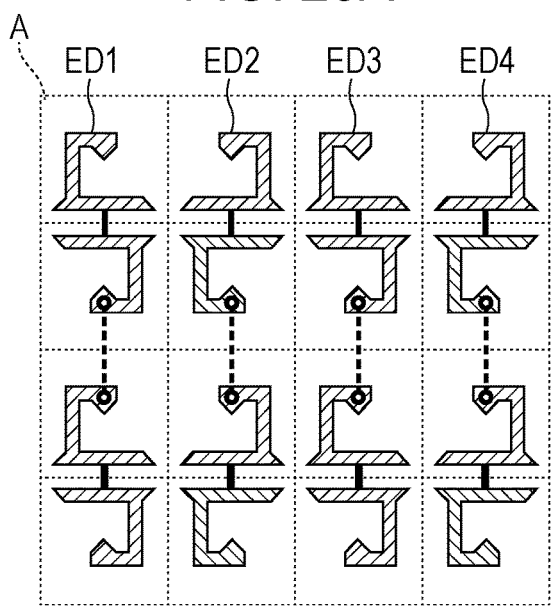
FIG. 20B
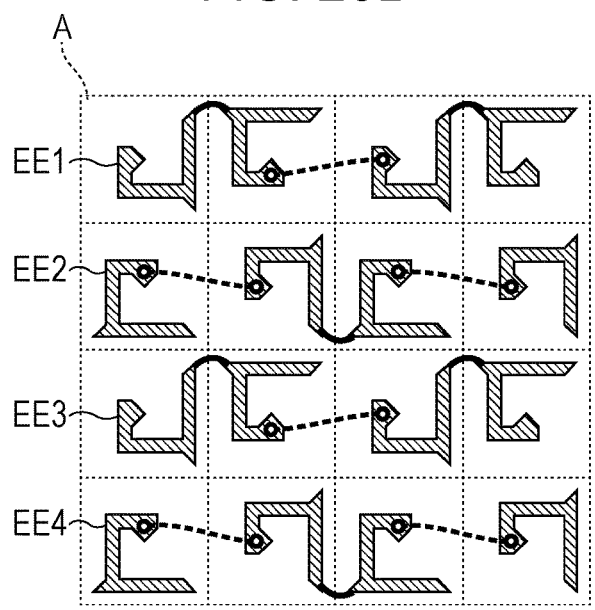
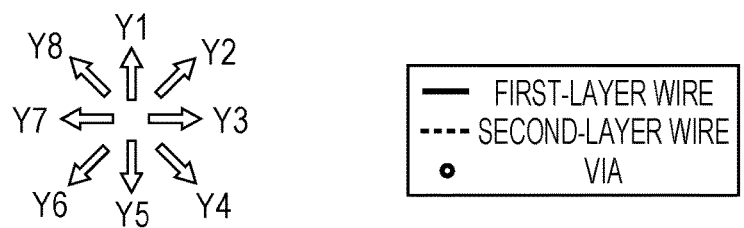

FIG. 21A
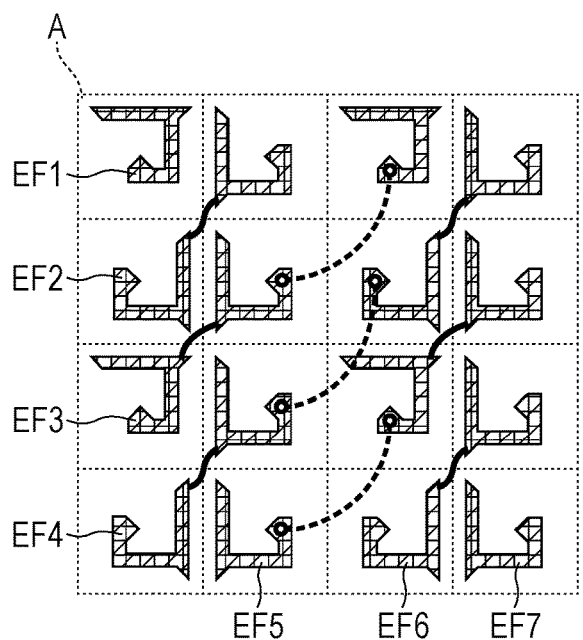
FIG. 21B
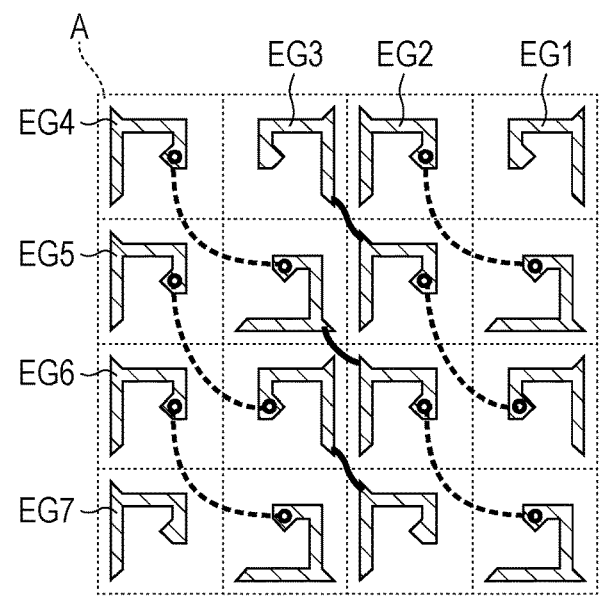
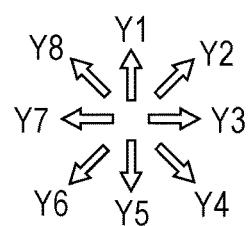
| — | FIRST-LAYER WIRE |
| --- | --- |
| ---- | SECOND-LAYER WIRE |
| ⊙ | VIA |

FIG. 22A
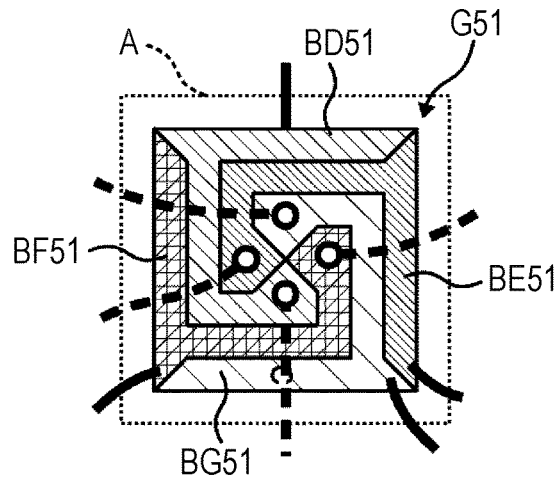
FIG. 22B
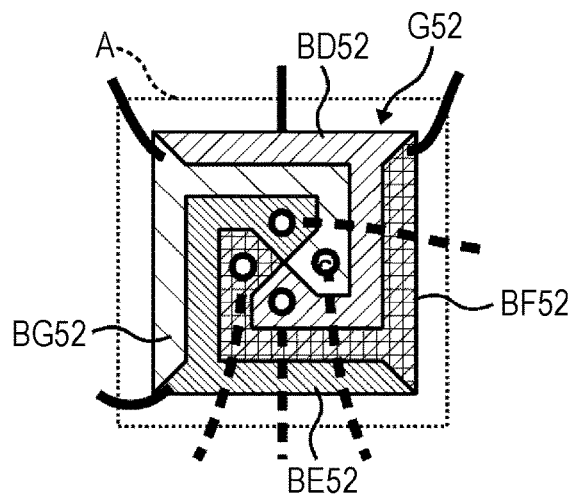
FIG. 22C
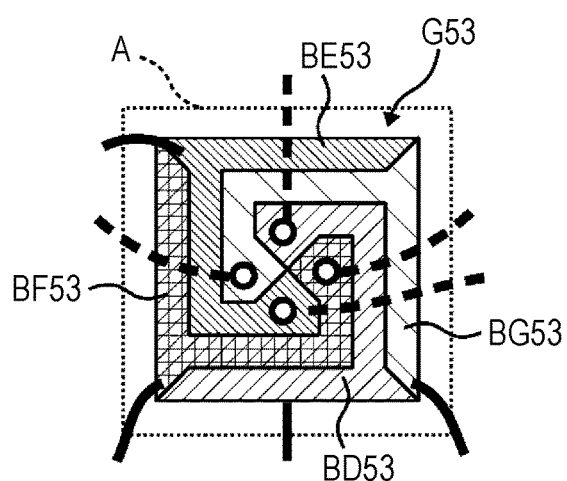
FIG. 22D
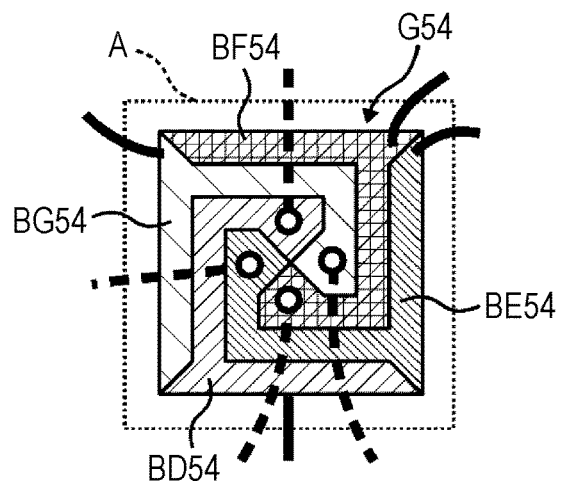
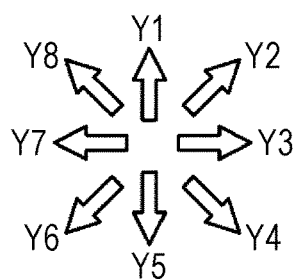
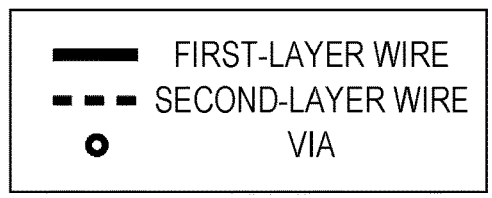

FIG. 24A
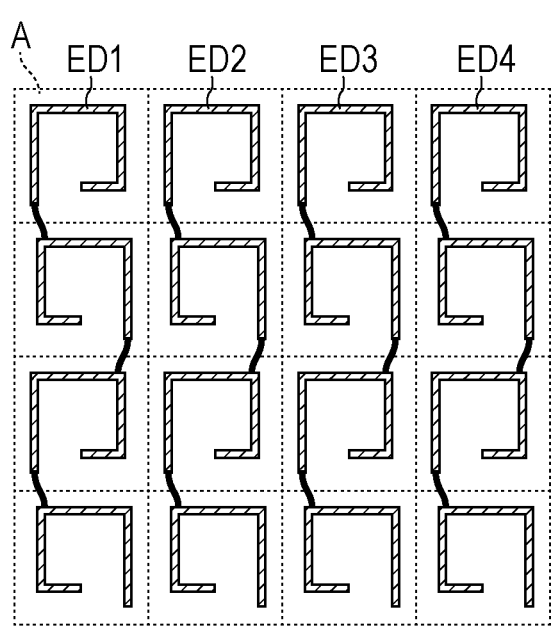
FIG. 24B
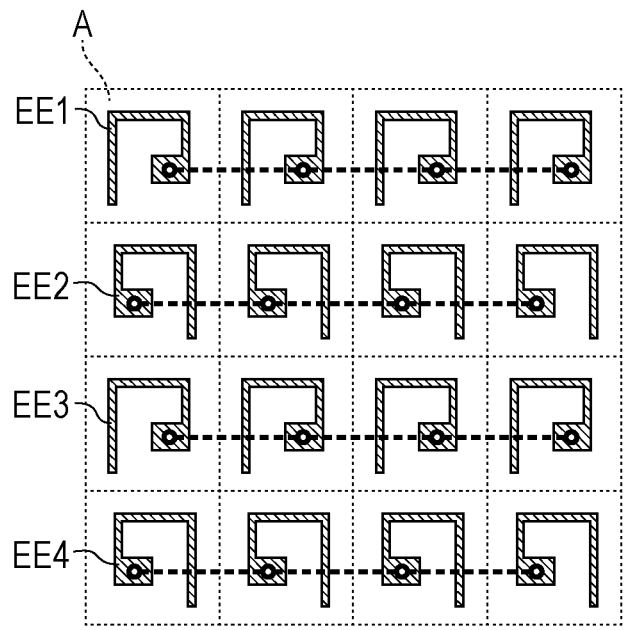
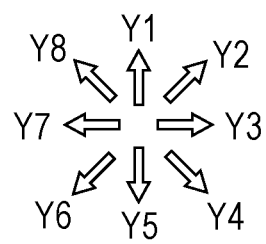

FIG. 25A
FIG. 25B
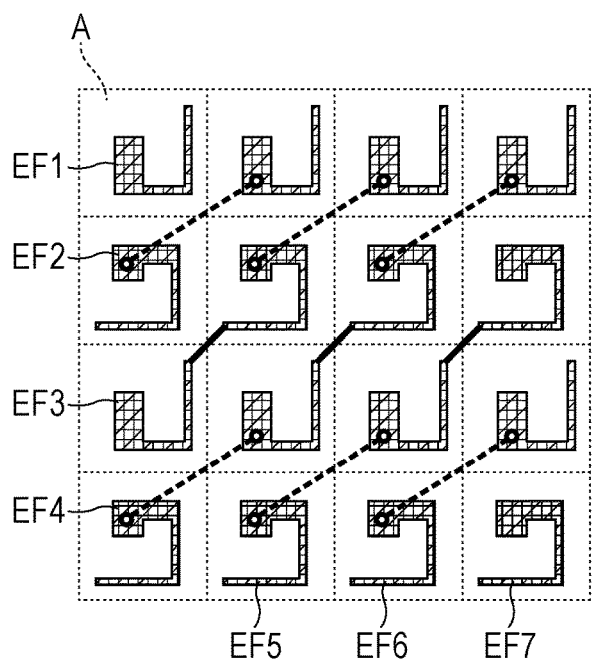
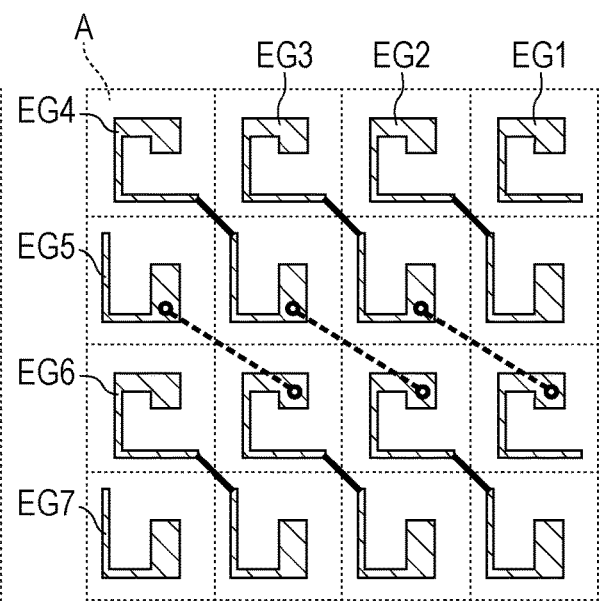
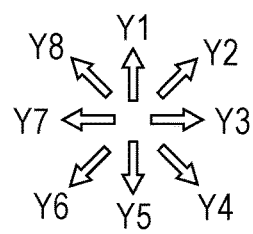
— FIRST-LAYER WIRE
---- SECOND-LAYER WIRE
○ VIA FIG. 26A
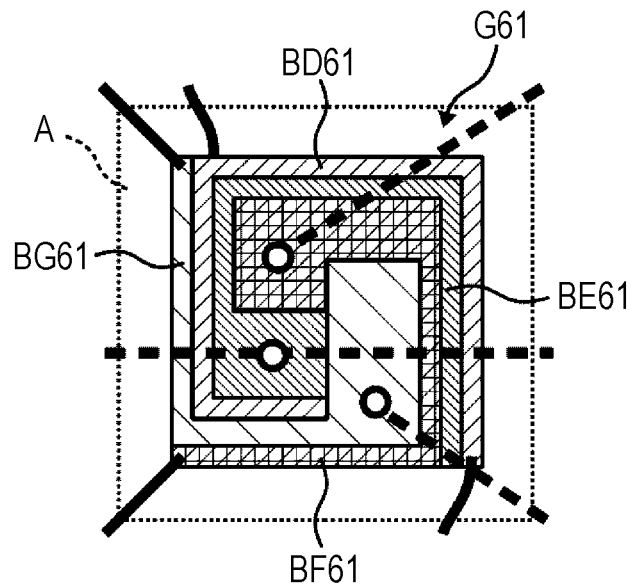
FIG. 26B
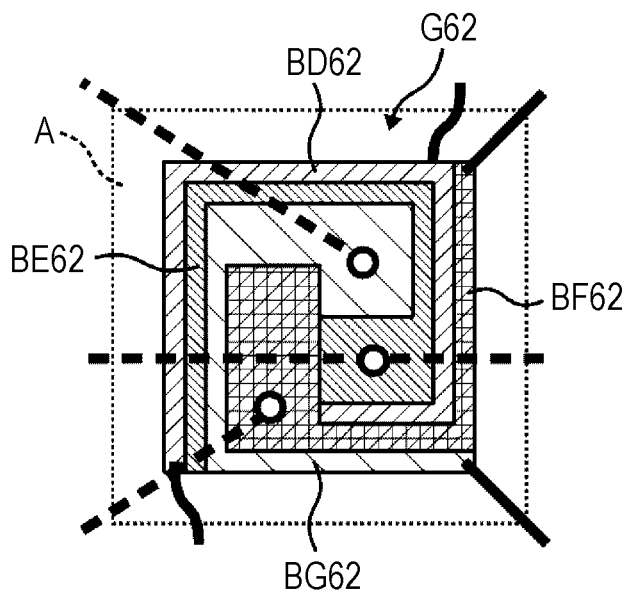
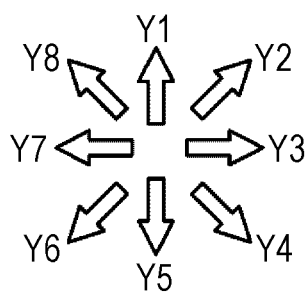

FIG. 28

$$P_1 \quad P_2 \quad \cdots \quad P_j \quad \cdots \quad P_M$$
$$\| \quad \quad \| \quad \quad \quad \| \quad \quad \quad \|$$

$$S_1 = U_{11} + U_{12} + \cdots + U_{1j} + \cdots + U_{1M}$$
$$+ \quad\quad + \quad\quad\quad + \quad\quad\quad +$$
$$S_2 = U_{21} + U_{22} + \cdots + U_{2j} + \cdots + U_{2M}$$
$$+ \quad\quad + \quad\quad\quad + \quad\quad\quad +$$
$$\vdots \quad\quad \vdots \quad\quad \vdots \quad\quad\quad \vdots \quad\quad\quad \vdots$$
$$+ \quad\quad + \quad\quad\quad + \quad\quad\quad +$$
$$S_i = U_{i1} + U_{i2} + \cdots + U_{ij} + \cdots + U_{iM}$$
$$+ \quad\quad + \quad\quad\quad + \quad\quad\quad +$$
$$\vdots \quad\quad \vdots \quad\quad \vdots \quad\quad\quad \vdots \quad\quad\quad \vdots$$
$$+ \quad\quad + \quad\quad\quad + \quad\quad\quad +$$
$$S_N = U_{N1} + U_{N2} + \cdots + U_{Nj} + \cdots + U_{NM}$$

FIG. 29

$P_1$  $P_2$  $\cdots$  $P_j$  $\cdots$  $P_M$ $\shortparallel$  $\shortparallel$  $\shortparallel$  $\shortparallel$ $S_1 = P_1 \times K_{11} + P_2 \times K_{12} + \cdots + P_j \times K_{1j} + \cdots + P_M \times K_{1M}$
$+$ $+$ $+$ $+$
$S_2 = P_1 \times K_{21} + P_2 \times K_{22} + \cdots + P_j \times K_{2j} + \cdots + P_M \times K_{2M}$
$+$ $+$ $+$ $+$
$\vdots$ $\vdots$ $\vdots$ $\vdots$ $\vdots$
$+$ $+$ $+$ $+$
$S_i = P_1 \times K_{i1} + P_2 \times K_{i2} + \cdots + P_j \times K_{ij} + \cdots + P_M \times K_{iM}$
$+$ $+$ $+$ $+$
$\vdots$ $\vdots$ $\vdots$ $\vdots$ $\vdots$
$+$ $+$ $+$ $+$
$S_N = P_1 \times K_{N1} + P_2 \times K_{N2} + \cdots + P_j \times K_{Nj} + \cdots + P_M \times K_{NM}$

FIG. 30

$$SA_1 = PA_1 \times K_{11} + PA_2 \times K_{12} + \cdots + PA_j \times K_{1j} + \cdots + PA_M \times K_{1M}$$

$$+$$

$$SA_2 = PA_1 \times K_{21} + PA_2 \times K_{22} + \cdots + PA_j \times K_{2j} + \cdots + PA_M \times K_{2M}$$

$$+$$

$$\vdots$$

$$+$$

$$SA_i = PA_1 \times K_{i1} + PA_2 \times K_{i2} + \cdots + PA_j \times K_{ij} + \cdots + PA_M \times K_{iM}$$

$$+$$

$$\vdots$$

$$+$$

$$SA_N = PA_1 \times K_{N1} + PA_2 \times K_{N2} + \cdots + PA_j \times K_{Nj} + \cdots + PA_M \times K_{NM}$$

$$\shortparallel \quad \shortparallel \quad \shortparallel \quad \shortparallel$$

$$PA_1 \quad PA_2 \quad PA_j \quad PA_M$$

FIG. 34
PRIOR ART
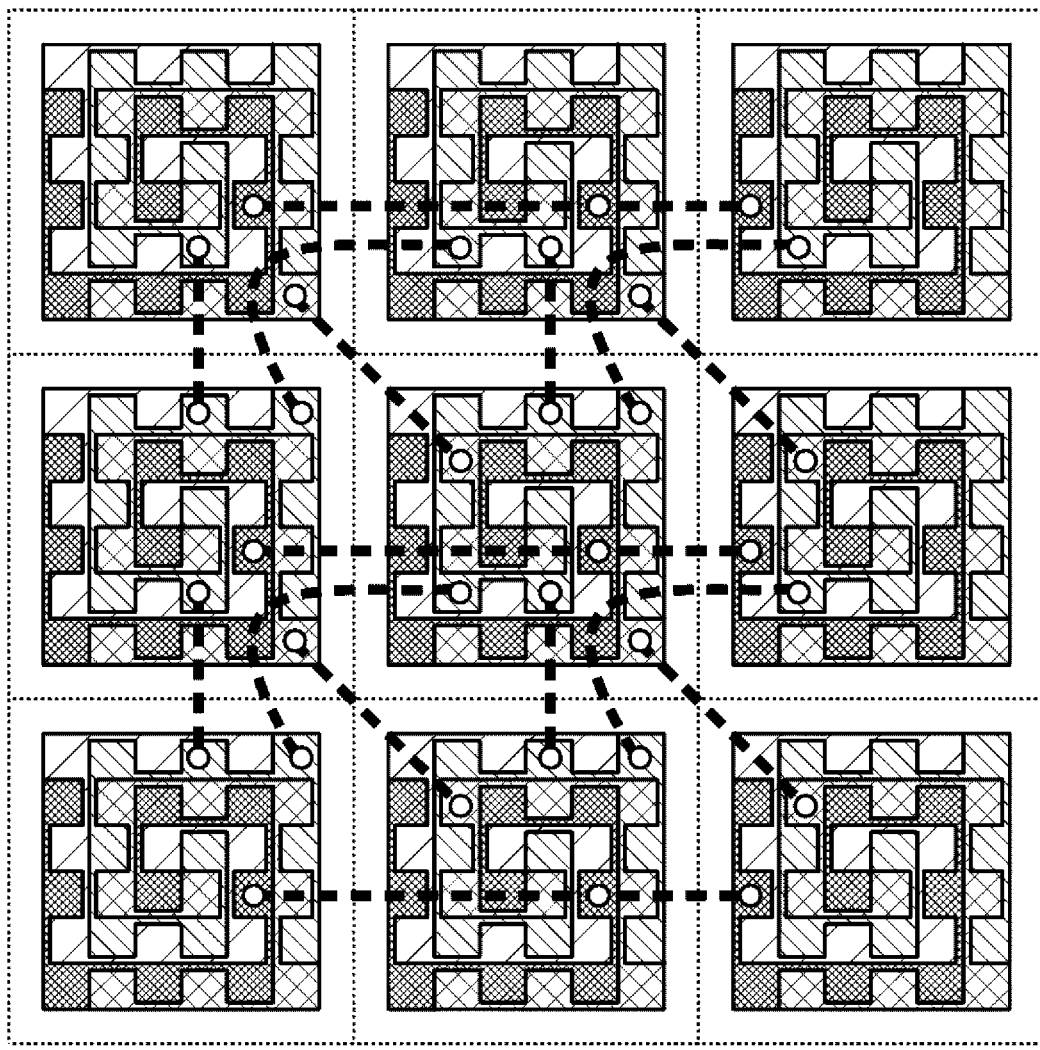

FIG. 35
PRIOR ART
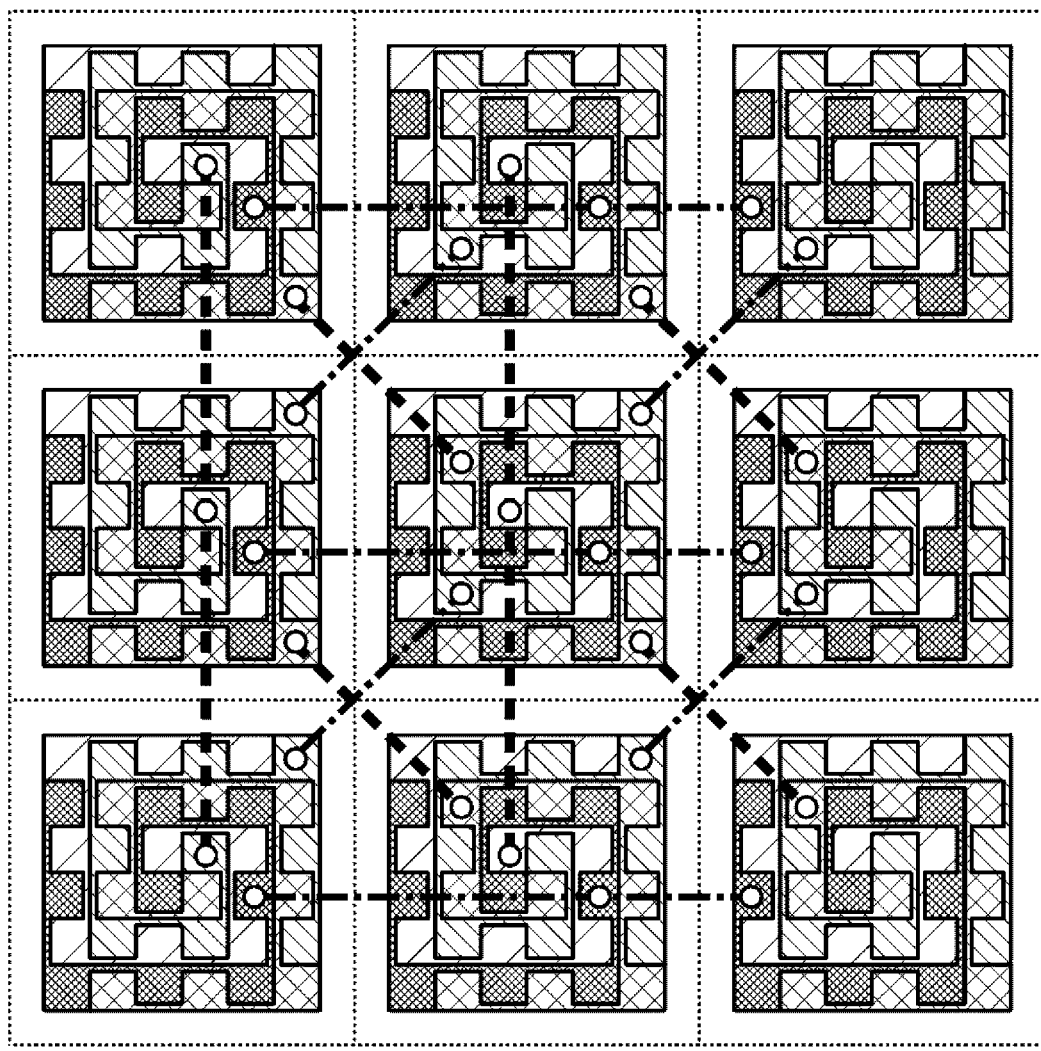
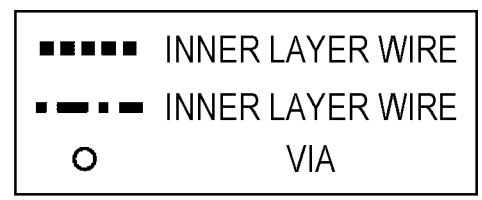

CAPACITIVE SENSOR AND INPUT DEVICE

CLAIM OF PRIORITY

This application is a Continuation of International Application No. PCT/JP2017/047324 filed on Dec. 28, 2017, which claims benefit of Japanese Patent Application No. 2017-027349 filed on Feb. 16, 2017. The entire contents of each application noted above are incorporated herein by reference.

BACKGROUND OF THE INVENTION

1. Field of the Invention

The present invention relates to a capacitive sensor for detecting a change in electrostatic capacitance and an input device for inputting information in accordance with a change in electrostatic capacitance.

2. Description of the Related Art

A capacitive sensor for detecting a change in electrostatic capacitance caused by proximity of an object such as a finger is conventionally known. A capacitive sensor used for an input device such as a touch pad typically has a structure in which a plurality of electrodes for detection are arranged on a plane (see, for example, International Publication No. 2016/021356, U.S. Patent Application Publication No. 2008/0150906, and U.S. Patent Application Publication No. 2015/0179122 described below). When an object approaches these electrodes, electrostatic capacitance (self capacitance) between the electrodes for detection and the object and electrostatic capacitance (mutual capacitance) between the electrodes change, and therefore proximity of an object and a degree of proximity of the object can be detected as a change in electrostatic capacitance.

FIGS. 33A and 33B illustrate a structure of a capacitive sensor described in International Publication No. 2016/021356. FIG. 33A illustrates a structure of a detection element in a single section, and FIG. 33B illustrates detection electrodes in four directions that constitute this detection element. As illustrated in FIG. 33B, the detection element of FIG. 33A is formed at a place where the electrodes (Ea, Eb, Ec, and Ed) extending in the four direction intersect one another. By providing a plurality of combinations of electrodes (Ea, Eb, Ec, and Ed) extending in the four direction, a plurality of intersections are formed, and the detection element of FIG. 33A is formed at each of the intersections. Since the electrodes (Ea, Eb, Ec, and Ed) extending in the four direction should not be conductive with one another, wiring is required such that the electrodes avoid each other in each intersection.

FIGS. 34 and 35 illustrate an example of wiring between detection elements in a case where a plurality of detection elements are arranged in a matrix. Typically, a capacitive sensor is formed by using a printed board or the like, and wiring between electrodes for detection is provided in an inner layer (wiring layer) of the board. In a case where the board has one inner layer which can be used for wiring, seven vias are needed for each detection element as illustrated in FIG. 34. Meanwhile, in a case where two wiring layers are used, the number of vias per detection element is six as illustrated in FIG. 35. In order to reduce cost of a capacitive sensor, it is desirable to reduce the number of vias (interlayer wirings) without increasing the number of inner layers.

SUMMARY OF THE INVENTION

The present invention is made in view of the above circumstances, and the present invention provides a capacitive sensor and an input device which are capable of suppressing the number of inner layers used for wiring and the number of vias (interlayer wirings).

Solution to Problem

A first aspect of the present invention relates to a capacitive sensor for detecting a change in electrostatic capacitance caused by a change in position of an object in each of a plurality of sections that divide a region to which the object is approachable. The capacitive sensor includes a plurality of detection electrodes each including a plurality of partial electrodes connected in cascade via wiring; a first layer in which the partial electrodes and the wiring are disposed; and a second layer in which the wiring is disposed. Each of the plurality of detection electrodes belongs to any one of three or more detection electrode groups, the detection electrodes that belong to a same one of the detection electrode groups among the plurality of detection electrodes do not intersect one another, and the detection electrodes that belong to different ones of the detection electrode groups among the plurality of detection electrodes intersect one another while being in the first layer and the second layer, respectively. Three or more partial electrodes included in three or more different ones of the detection electrodes belonging to different ones of the detection electrode groups are located in each of the plurality of sections. The three or more detection electrodes belonging to the different ones of the detection electrode groups intersect one another in an inner one of the sections surrounded by other sections. The three or more partial electrodes located in the inner section include a single first partial electrode and at least two second partial electrodes. The first partial electrode is connected in cascade to the partial electrode on one side via the wiring passing through the first layer or the second layer and is connected in cascade to the partial electrode on the other side via the wiring passing through the second layer. Each of the second partial electrodes is connected in cascade to the partial electrode on one side via the wiring passing through the first layer and is connected in cascade to the partial electrode on the other side via the wiring passing through the second layer.

According to the configuration, the first partial electrode is connected in cascade to the partial electrode on one side via the wiring passing through the first layer or the second layer and is connected in cascade to the partial electrode on the other side via the wiring passing through the second layer. Accordingly, the number of vias (an interlayer wiring between the first layer and the second layer) in wiring leading to the first partial electrode is 1. Furthermore, each of the second partial electrodes is connected in cascade to the partial electrode on one side via the wiring passing through the first layer and is connected in cascade to the partial electrode on the other side via the wiring passing through the second layer. Accordingly, the number of vias in wiring leading to the second partial electrode is 1. Consequently, the number of inner layers used for wiring and the number of vias are kept small.

Suitably, the first partial electrode may be connected in cascade to the partial electrode on one side via the wiring passing through the first layer and may be connected in cascade to the partial electrode on the other side via the wiring passing through the second layer.

According to this configuration, the number of vias in wiring leading to the first partial electrode is 1, and therefore the number of inner layers used for wiring and the number of vias are kept small.

Suitably, the first partial electrode may be connected in cascade to the partial electrode on one side via the wiring passing through the second layer and may be connected in cascade to the partial electrode on the other side via the wiring passing through the second layer.

According to this configuration, the number of vias in wiring leading to the first partial electrode is 1, and therefore the number of inner layers used for wiring and the number of vias are kept small.

Suitably, the three or more partial electrodes located in the inner section may include a single third partial electrode. The third partial electrode may be connected in cascade to the partial electrode on one side via the wiring passing through the first layer and may be connected in cascade to the partial electrode on the other side via the wiring passing through the first layer.

According to this configuration, the third partial electrode is connected in cascade to the partial electrode on one side via the wiring passing through the first layer and is connected in cascade to the partial electrode on the other side via the wiring passing through the first layer. Accordingly, the number of vias in wiring leading to the third partial electrode is zero. Consequently, the number of inner layers used for wiring and the number of vias are kept small.

Suitably, a shape of each of the sections may be rotationally symmetric, and at least one pair of partial electrodes located in a same one of the sections may have shapes that are rotationally symmetric with each other about a central point of the section.

More preferably, at least one pair of partial electrodes located in a same one of the sections may have shapes that are two-fold symmetric with each other about a central point of the section.

With the configuration, a center of a distribution of sensitivity of mutual capacitance in the at least one pair of partial electrodes is close to a center of the section.

A second aspect of the present invention relates to an input device for inputting information according to a change in electrostatic capacitance caused by a change in position of an object in each of a plurality of sections that divide a region to which the object is approachable. This input device includes the capacitive sensor according to the first aspect; an electrostatic capacitance detection unit; and an element data configuring unit.

Suitably, the capacitive sensor includes N detection electrodes as the plurality of detection electrodes. The electrostatic capacitance detection unit generates, for each of the N detection electrodes, detection data corresponding to first electrostatic capacitance between the object and the detection electrode. The element data configuring unit configures M (M is a natural number larger than N) pieces of element data indicative of degrees of proximity of the object in the respective M sections on a basis of the N pieces of detection data. Each of the M pieces of element data is a sum of partial element data distributed to the respective N pieces of detection data at predetermined proportions, and each of the N pieces of detection data is approximate to a sum of the partial element data distributed from the M pieces of element data at the predetermined proportions. Each of the partial element data is approximate to second electrostatic capacitance between one of the partial electrodes and the object in one of the sections, and each of the element data is approximate to third electrostatic capacitance obtained by summing up all second electrostatic capacitances in one of the sections. The element data configuring unit repeats data configuring processing for calculating assumed values of the N pieces of detection data as sums of the partial element data distributed from assumed values of the M pieces of element data at the predetermined proportions and modifying the assumed values of the M pieces of element data on a basis of the N predetermined proportions set for each of the M pieces of element data so that the calculated assumed values of the N pieces of detection data approach the N pieces of detection data.

According to the configuration, three or more partial electrodes included in three or more different detection electrodes belonging to different detection electrode groups are located in each of the M sections that divide a region to which the object is approachable, and the electrostatic capacitance detection unit generates, for each of the N detection electrodes, detection data corresponding to the first electrostatic capacitance between the object and the detection electrode as data indicative of a degree of proximity of the object.

Furthermore, each of the M pieces of element data is a sum of partial element data distributed to the respective N pieces of detection data at predetermined proportions, and each of the N pieces of detection data is approximate to a sum of the partial element data distributed from the M pieces of element data at the predetermined proportions. That is, conversion from the M pieces of element data into the N pieces of detection data is defined by the N predetermined proportions set for each of the M pieces of element data.

In the data configuring processing, assumed values of the N pieces of detection data are calculated as sums of the partial element data distributed from assumed values of the M pieces of element data at the predetermined proportions. Furthermore, the assumed values of the M pieces of element data are modified on the basis of the N predetermined proportions set for each of the M pieces of element data so that the calculated assumed values of the N pieces of detection data approach the N pieces of detection data. By repeating this data configuring processing, the element data that matches the N pieces of detection data is obtained.

Suitably, each of the predetermined proportions has a value corresponding to an area ratio of a single partial electrode in a single section to all of the partial electrodes in the single section.

According to the present invention, it is possible to provide a capacitive sensor and an input device that can suppress the number of inner layers used for wiring and the number of vias (interlayer wirings).

BRIEF DESCRIPTION OF THE DRAWINGS

FIGS. 5A through 5C illustrate a structure of the capacitive sensor illustrated in FIG. 4 for respective detection electrode groups;

FIGS. 6A and 6B illustrate two kinds of partial electrode groups in the capacitive sensor illustrated in FIG. 4, respectively;

FIGS. 8A through 8C illustrate a structure of the capacitive sensor illustrated in FIG. 7 for respective detection electrode groups;

FIGS. 9A through 9D illustrate four kinds of partial electrode groups in the capacitive sensor illustrated in FIG. 7, respectively;

FIGS. 11A and 11B are first views illustrating a structure of the capacitive sensor illustrated in FIG. 10 for respective detection electrode groups;

FIGS. 12A and 12B are second views illustrating a structure of the capacitive sensor illustrated in FIG. 10 for respective detection electrode groups;

FIGS. 13A and 13B illustrate two kinds of partial electrode groups in the capacitive sensor illustrated in FIG. 10, respectively;

FIGS. 15A and 15B are first views illustrating a structure of the capacitive sensor illustrated in FIG. 14 for respective detection electrode groups;

FIGS. 16A and 16B are second views illustrating a structure of the capacitive sensor illustrated in FIG. 14 for respective detection electrode groups;

FIGS. 17A through 17D illustrate four kinds of partial electrode groups in the capacitive sensor illustrated in FIG. 14, respectively;

FIG. 19 illustrates an example of a structure of a capacitive sensor according to a fifth embodiment;

FIGS. 20A and 20B are first views illustrating a structure of the capacitive sensor illustrated in FIG. 19 for respective detection electrode groups;

FIGS. 21A and 21B are second views illustrating a structure of the capacitive sensor illustrated in FIG. 19 for respective detection electrode groups;

FIGS. 22A through 22D illustrate four kinds of partial electrode groups in the capacitive sensor illustrated in FIG. 19, respectively;

FIGS. 24A and 24B are first views illustrating a structure of the capacitive sensor illustrated in FIG. 23 for respective detection electrode groups;

FIGS. 25A and 25B are second views illustrating a structure of the capacitive sensor illustrated in FIG. 23 for respective detection electrode groups;

FIGS. 26A and 26B illustrate two kinds of partial electrode groups in the capacitive sensor illustrated in FIG. 23, respectively;

FIG. 28 illustrates a relationship between N pieces of detection data and M pieces of partial element data;

FIG. 29 is a view for explaining conversion from the M pieces of element data into the N pieces of detection data;

FIG. 30 is a view for explaining conversion from assumed values of the M pieces of element data into assumed values of the N pieces of detection data;

FIG. 34 illustrates an example of wiring between detection elements in a case where a single wiring layer is used; and FIG. 35 illustrates an example of wiring between detection elements in a case where two wiring layers are used.

DESCRIPTION OF THE DISCLOSURE

First Embodiment

Figure 1A:
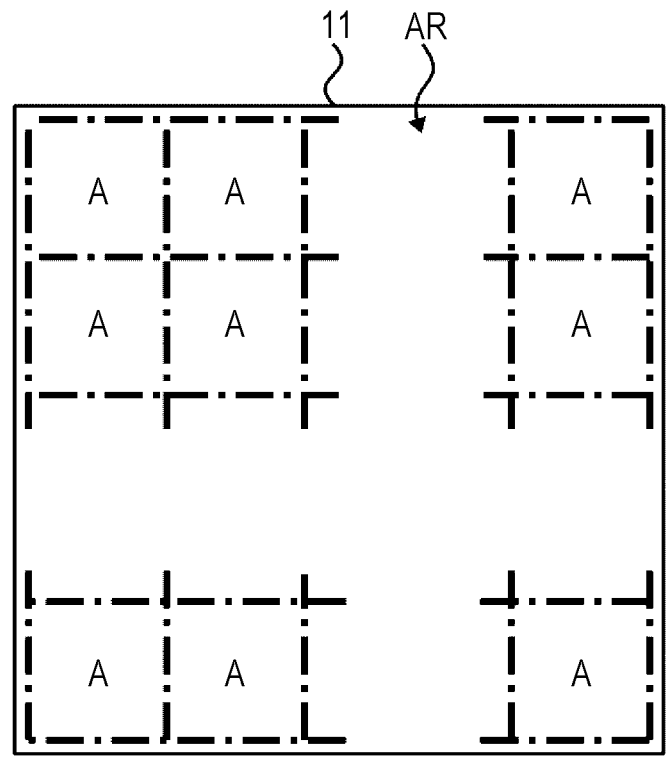
FIGS. 1A and 1B illustrate an outline configuration of a capacitive sensor according to an embodiment of the present invention.
Figure 1B:
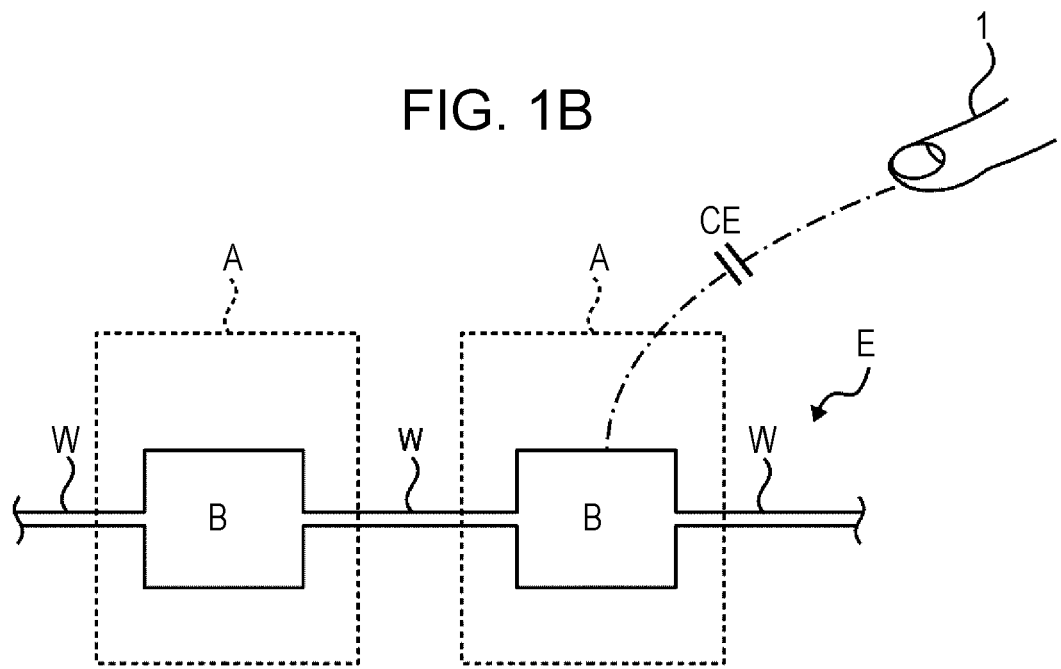

First, an outline configuration of a capacitive sensor according to an embodiment of the present invention is described below with reference to FIGS. 1A and 1B. As illustrated in FIG. 1A, a capacitive sensor 11 according to the present embodiment has a plurality of sections A that divide a region AR (e.g., an operation screen of an input device) to which an object 1 such as a finger can be in proximity. In each of the sections A, a change in electrostatic capacitance caused by a change in position of the object 1 is detected. The line with alternate long and short dashes illustrated in FIG. 1A is a line virtually indicating a boundary line between the sections A, and this boundary line cannot be actually viewed.

The capacitive sensor 11 according to the present embodiment has a plurality of detection electrodes E in which electrostatic capacitance varies in accordance with a change in position of an object. For example, as illustrated in FIG. 1B, each of the detection electrodes E includes a plurality of partial electrodes B that are connected in cascade via wiring W. A single partial electrode B is located in a single section A.

Figure 2:
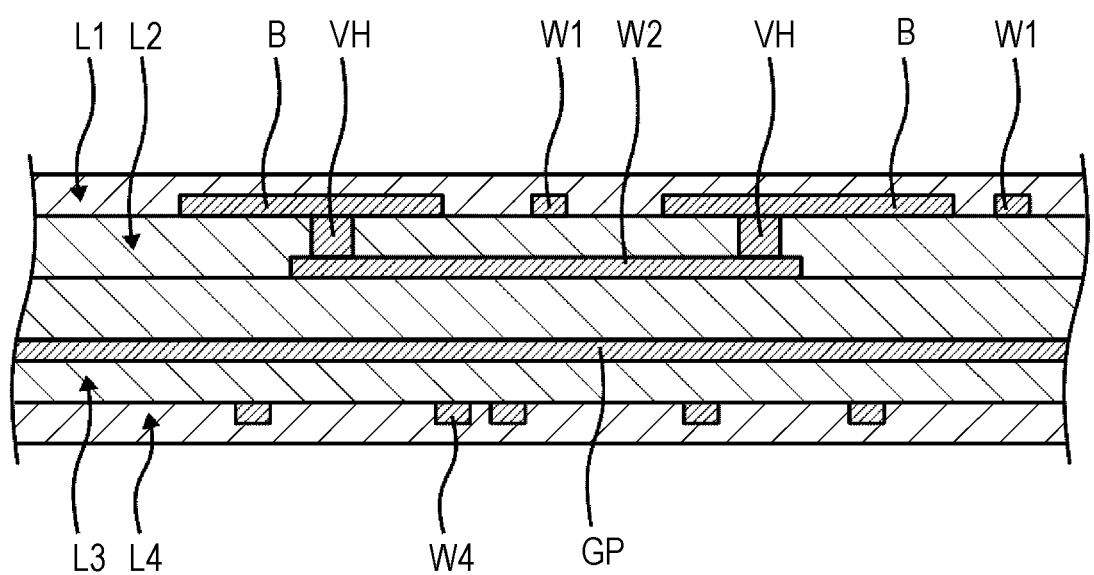
FIG. 2 illustrates an example of a layer structure of the capacitive sensor according to the embodiment of the present invention.

The capacitive sensor 11 according to the present embodiment is, for example, a printed board having a plate shape or a sheet shape and has a layer structure as illustrated in FIG. 2. In the example of FIG. 2, the capacitive sensor 11 has four layers (L1 through L4). The first layer L1 and the fourth layer L4 are outer layers, and the second layer L2 and the third layer L3 are inner layers. In the first layer L1, the partial electrodes B of the detection electrodes E and a part (a first layer wiring W1) of the wiring W that connects the partial electrodes B are provided. In the second layer L2 that is in contact with the first layer L1, a part (a second layer wiring W2) of the wiring W of the detection electrodes E is provided. The second layer wiring W2 is connected to the partial electrodes B and the first layer wiring W1 through vias VH (interlayer wiring). In the third layer L3, a ground plane GP is provided. In the fourth layer L4, wiring W4 of an electronic circuit or the like is provided.

The plurality of detection electrodes E of the capacitive sensor 11 are classified into three or more groups. The groups of detection electrodes E (detection electrode groups) are, for example, classifications based on directions (e.g., a longitudinal direction, a lateral direction, and a diagonal direction) in which the detection electrodes E extend on the region AR. Note, however, that the detection electrodes E according to the present invention need not necessarily extend linearly and may be curved or may be bent. That is, each of the detection electrode groups specifies detection electrodes E that do not intersect one another in the region AR, and detection electrodes E belonging to an identical detection electrode group do not intersect one another. Conversely, at least parts of detection electrodes E that belong to different detection electrode groups intersect each other in a section A of the region AR. Detection electrodes E that intersect each other intersect each other while being in the first layer L1 and the second layer L2, respectively, so as not to electrically contact each other (intersect each other in a place where one of the detection electrodes E is in the first layer L1 and the other one of the detection electrodes E is in the second layer L2).

In the capacitive sensor 11 according to the present embodiment, three or more partial electrodes B are located in each of the plurality of sections A, and the three or more partial electrodes are included in three or more different detection electrode groups E belonging to different detection electrode groups, respectively. That is, the three or more partial electrodes B located in an identical section A are included in respective different detection electrodes E, and these detection electrodes E belong to detection electrode groups different each other.

As stated above, since partial electrodes B included in three or more different detection electrodes E belonging to detection electrode groups different each other are located in a single section A, three or more detection electrodes E belonging to detection electrode groups different each other intersect one another in an inner section A (hereinafter sometimes simply referred to as an "inner section A") surrounded by other sections A.

Figure 3A:
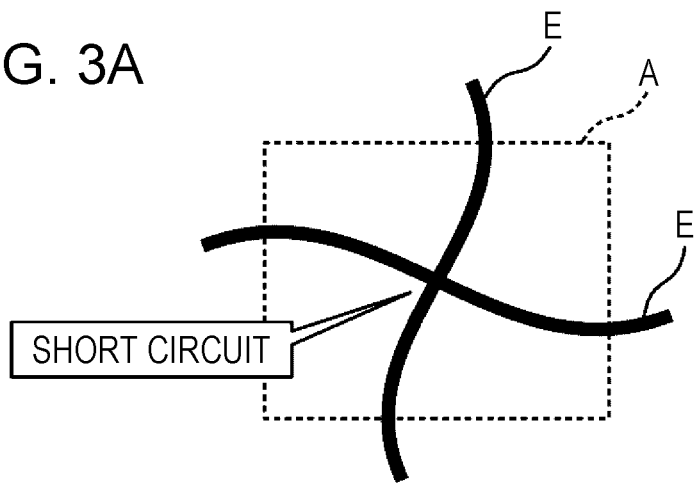
FIGS. 3A through 3C are views for explaining how detection electrodes in a section intersect one another.
Figure 3B:
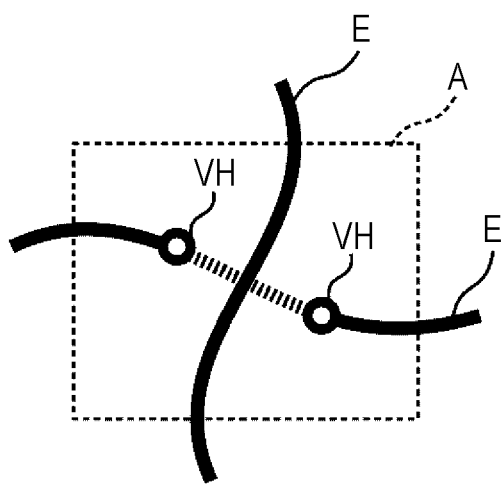
Figure 3C:
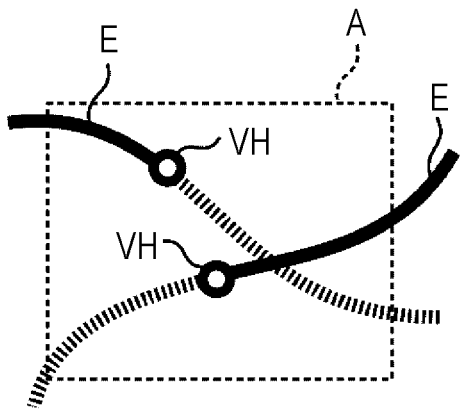

FIGS. 3A through 3C are views for explaining how detection electrodes E intersect each other in a section A. If two detection electrodes E intersect each other in an identical layer (L1 or L2), the detection electrodes E are short-circuited as illustrated in FIG. 3A. It is therefore necessary to make one of the detection electrodes E detour to another layer through a via VH. In the example of FIG. 3B, two vias VH are used to make one of the detection electrodes E detour. In a case where partial electrodes B are connected only by wiring in a single inner layer, detection electrodes E excluding a single detection electrode E that occupies the inner layer basically need detour wiring as illustrated in FIG. 3B. Accordingly, it is necessary to provide two vias VH for each detection electrode E that needs detour wiring. In view of this, in the capacitive sensor 11 according to the present embodiment, the number of vias VH per detection electrode E in a single section A is limited to 1 or less, so that the detection electrodes E intersect each other in a state illustrated in FIG. 3C.

In the present embodiment, three or more partial electrodes B located in the inner section A include a single first partial electrode and at least two second partial electrodes. The first partial electrode is connected in cascade to a partial electrode B on one side through the first layer wiring W1 passing the first layer L1 or the second layer wiring W2 passing the second layer L2 and is connected in cascade to a partial electrode B on the other side through the second layer wiring W2 passing the second layer L2. That is, the first partial electrode is a partial electrode B that is wired so as to take a detour through a single via VH as illustrated in FIG. 3C or a partial electrode B that is wired only in another partial electrode B only in the second layer L2 (not illustrated in FIG. 3C). Meanwhile, each of the second partial electrodes is a partial electrode B that is wired so as to take a detour through a single via VH as illustrated in FIG. 3C.

Next, an example of a more specific structure of the capacitive sensor 11 according to the present embodiment is described with reference to FIGS. 4 through 6.

Figure 4:
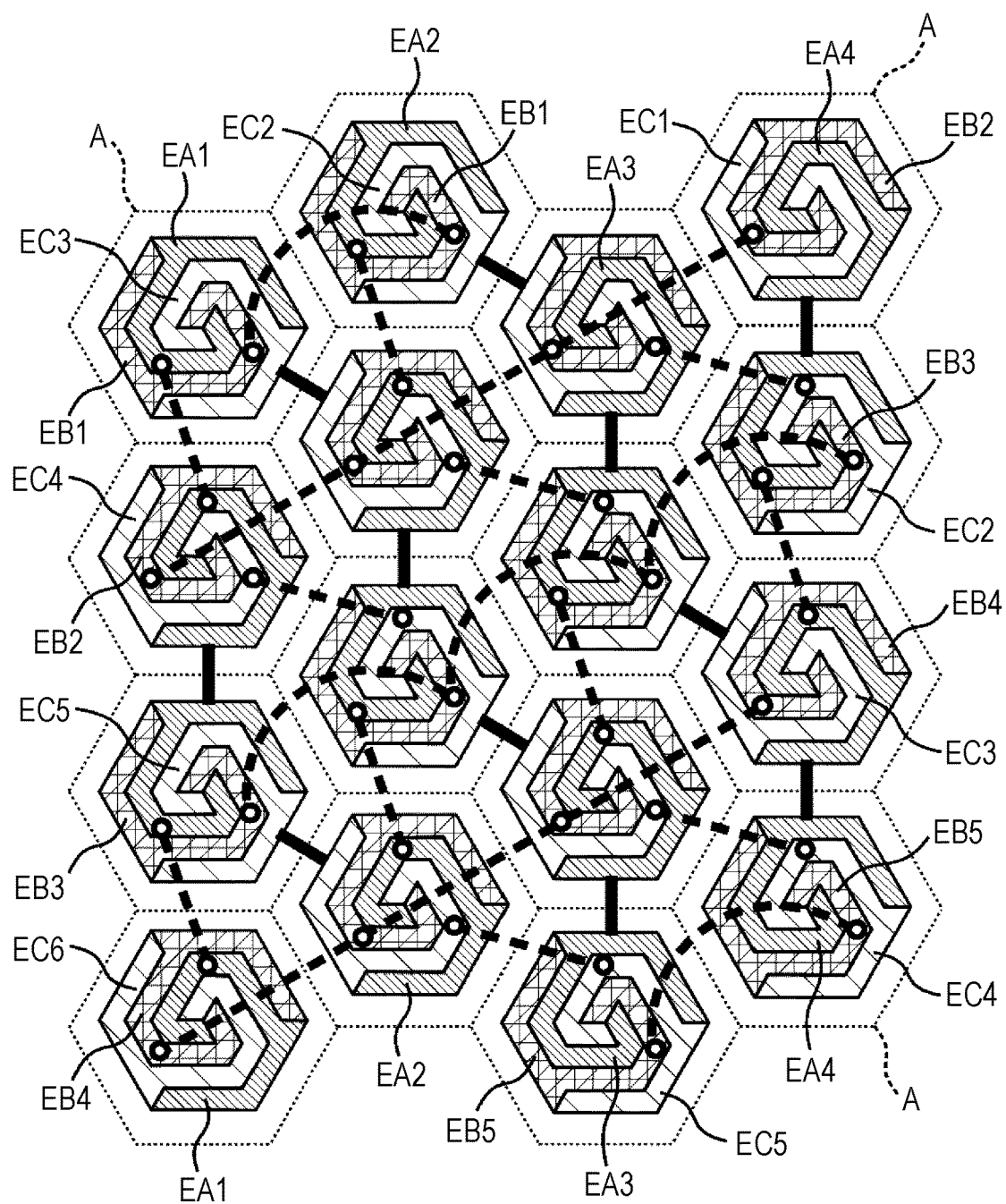
FIG. 4 illustrates an example of a structure of the capacitive sensor according to a first embodiment.

FIG. 4 illustrates an example of a structure of the capacitive sensor 11 according to the first embodiment. FIGS. 5A through 5C illustrate a structure of the capacitive sensor 11 illustrated in FIG. 4 for the respective detection electrode groups. The capacitive sensor 11 illustrated in FIGS. 4 and 5A through 5C is configured such that the region AR is divided in a honeycomb manner by regular hexagonal sections A. The detection electrodes E are classified into three detection electrode groups "EA1 through EA4", "EB1 through EB5", and "EC1 through EC6" in accordance with extension directions.

In FIGS. 4 and 5A through 5C, "X1" through "X6" represent directions of six sections A adjacent to a single section A. In plan view, "X1" through "X6" are arranged in this order in a certain direction (a clockwise direction on the paper in the example of FIGS. 4 and 5A through 5C). In the detection electrode group constituted by the detection electrodes EA1 through EA4, each detection electrode extends from an X4-side section A to an X1-side section A. In the detection electrode group constituted by the detection electrodes EB1 through EB5, each detection electrode extends from an X5-side section A to an X2-side section A. In the detection electrode group constituted by the detection electrodes EC1 through EC6, each detection electrode extends from an X6-side section A to an X3-side section A. Hereinafter, each of the detection electrodes EA1 through EA4 is sometimes referred to as a "detection electrode EA", each of the detection electrodes EB1 through EB5 is sometimes referred to as a "detection electrode EB", and each of the detection electrodes EC1 through EC6 is sometimes referred to as a "detection electrode EC".

As is clear from FIG. 4, there are two kinds of groups (hereinafter referred to as "partial electrode groups") of three partial electrodes B located in a single section A. FIGS. 6A and 6B illustrate two kinds of partial electrode groups G11 and G12 in the capacitive sensor 11 illustrated in FIG. 4, respectively.

The partial electrode group G11 illustrated in FIG. 6A has three partial electrodes (BA11, BB11, and BC11). The partial electrodes BA11, BB11, and BC11 are included in the detection electrodes EA, EB, and EC, respectively. The partial electrodes BA11, BC11, and BB11 are arranged in this order in a clockwise direction along an outer circumference of the partial electrode group G11 that faces surrounding sections A. Each of the three partial electrodes has a shape similar to "G", and the shapes of the three partial electrodes are rotationally symmetric with one another. That is, in a case where any pair of two partial electrodes is selected from among the three partial electrodes and one of the two partial electrodes is rotated by 120 degrees about a center of the regular hexagonal section A, the rotated partial electrode matches the other partial electrode.

The partial electrode group G12 illustrated in FIG. 6B has three partial electrodes (BA12, BB12, and BC12). The partial electrodes BA12, BB12, and BC12 are included in the detection electrodes EA, EB, and EC, respectively. The partial electrodes BA12, BC12, and BB12 are arranged in this order in a clockwise direction along an outer circumference of the partial electrode group G12 that faces surrounding sections A. These three partial electrodes have a shape similar to the shape of the partial electrodes (BA11, BB11, and BC11) of the partial electrode group G11.

The partial electrode groups G12, G11, G12, G12, G11, and G12 are located around the partial electrode group G11 in an order from the direction X1 to X6. The partial electrode groups G11, G12, G11, G11, G12, and G11 are located around the partial electrode group G12 in an order from the direction X1 to X6.

A difference between the partial electrode group G11 and the partial electrode group G12 lies in layout of the partial electrodes B corresponding to the respective detection electrode groups on an outer circumference side. Specifically, in the partial electrode group G11, an outer circumference of the partial electrode BA11 corresponding to the detection electrode EA faces the X1 side and the X2 side. Meanwhile, in the partial electrode group G12, an outer circumference of the partial electrode BA12 corresponding to the detection electrode EA faces the X3 side and the X4 side.

The partial electrode BA11 is connected in cascade to the partial electrode BA12 on one side through the first layer wiring W1 and is connected in cascade to the partial electrode BA12 on the other side through the second layer wiring W2. The partial electrode BC11 is connected in cascade to the partial electrode BC12 on one side through the first layer wiring W1 and is connected in cascade to the partial electrode BC12 on the other side through the second layer wiring W2. The partial electrode BB11 is connected in cascade to the partial electrodes BB11 on both sides through the second layer wiring W2. The partial electrode BB12 is connected in cascade to the partial electrodes BB12 on both sides through the second layer wiring W2. The partial electrodes BA11, BA12, BC11, and BC12 are the second partial electrodes, and the partial electrodes BB11 and BB12 are the first partial electrodes.

As described above, according to the capacitive sensor 11 according to the present embodiment, the partial electrodes B of the detection electrodes E are wired by using not only the second layer L2 for wiring but also the first layer L1 in which the partial electrodes B are provided, and the number of vias VH used for a single detection electrode E in a single section A is only 1. It is therefore possible to reduce the number of vias used without increasing the number of inner layers.

Second Embodiment

Next, a second embodiment of the present invention is described. A capacitive sensor 11 according to the present embodiment is different from the capacitive sensor 11 illustrated in FIG. 4 in a configuration and a wiring pattern of partial electrode groups and is basically identical to the capacitive sensor 11 illustrated in FIG. 4 in other main constituents.

Figure 7:
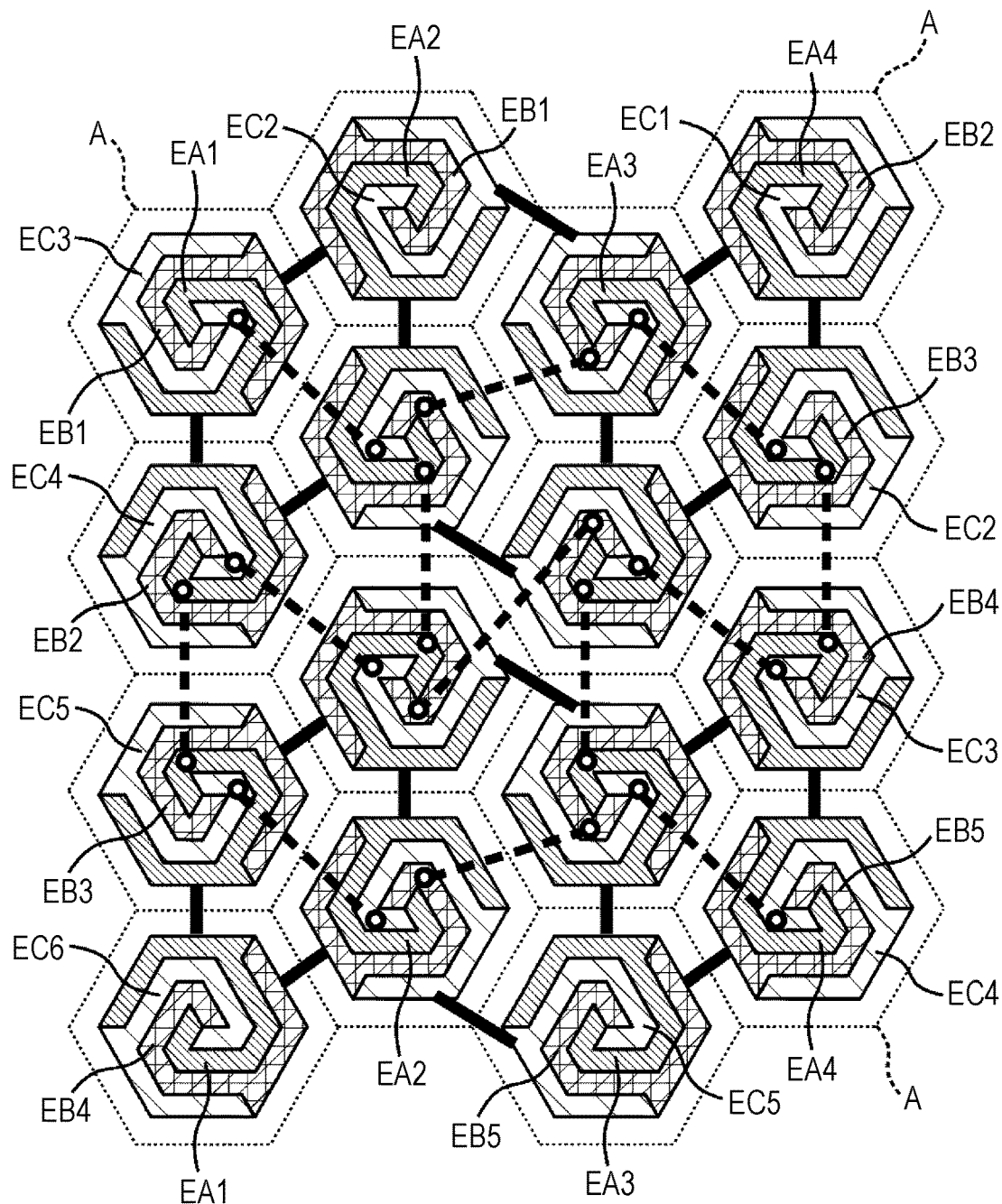
FIG. 7 illustrates an example of a structure of a capacitive sensor according to a second embodiment.

FIG. 7 illustrates an example of a structure of the capacitive sensor 11 according to the second embodiment. FIGS. 8A through 8C illustrate a structure of the capacitive sensor 11 illustrated in FIG. 7 for respective detection electrode groups. As is clear from comparison between FIG. 4 and FIG. 7, the capacitive sensor 11 illustrated in FIG. 4 is configured such that the partial electrodes B of the detection electrode EB are connected in cascade only through the second layer wiring W2, whereas the capacitive sensor 11 illustrated in FIG. 7 is configured such that partial electrodes B of a detection electrode EB are connected in cascade through a first layer wiring W1 and a second layer wiring W2.

FIGS. 9A through 9D illustrate four kinds of partial electrode groups (G21 through G24) in the capacitive sensor illustrated in FIG. 7. The partial electrode group G21 illustrated in FIG. 9A has three partial electrodes (BA21, BB21, and BC21). The partial electrodes BA21, BB21, and BC21 are included in the detection electrodes EA, EB, and EC, respectively. The partial electrodes BA21, BC21, and BB21 are arranged in this order in a clockwise direction along an outer circumference of the partial electrode group G21 that faces surrounding sections A. These three partial electrodes have a shape similar to the shape of the partial electrodes of FIGS. 6A and 6B.

The partial electrode group G22 illustrated in FIG. 9B has three partial electrodes (BA22, BB22, and BC22). The partial electrodes BA22, BB22, and BC22 are included in the detection electrodes EA, EB, and EC, respectively. The partial electrodes BA22, BB22, and BC22 are arranged in this order in a clockwise direction along an outer circumference of the partial electrode group G22 that faces surrounding sections A. These three partial electrodes have a shape similar to the shape of the partial electrodes of FIGS. 6A and 6B.

The partial electrode group G23 illustrated in FIG. 9C has three partial electrodes (BA23, BB23, and BC23). The partial electrodes BA23, BB23, and BC23 are included in the detection electrodes EA, EB, and EC, respectively. The partial electrodes BA23, BB23, and BC23 are arranged in this order in a clockwise direction along an outer circumference of the partial electrode group G23 that faces surrounding sections A. These three partial electrodes have a shape similar to the shape of the partial electrodes of FIGS. 6A and 6B.

The partial electrode group G24 illustrated in FIG. 9D has three partial electrodes (BA24, BB24, and BC24). The partial electrodes BA24, BB24, and BC24 are included in the detection electrodes EA, EB, and EC, respectively. The partial electrodes BA24, BC24, BB24 are arranged in this order in a clockwise direction along an outer circumference of the partial electrode group G24 that faces surrounding sections A. These three partial electrodes have a shape similar to the shape of the partial electrodes of FIGS. 6A and 6B.

The partial electrode groups G23, G24, G22, G23, G22, and G24 are located around the partial electrode group G21 in an order from the direction X1 to the direction X6. The partial electrode groups G24, G21, G23, G24, G23, and G21 are located around the partial electrode group G22 in the order from the direction X1 to the direction X6. The partial electrode groups G21, G22, G24, G21, G24, and G22 are located around the partial electrode group G23 in the order from the direction X1 to the direction X6. The partial electrode groups G22, G23, G21, G22, G21, and G23 are located around the partial electrode group G24 in the order from the direction X1 to the direction X6.

The partial electrode BA21 is connected in cascade to the partial electrode BA23 on one side through the first layer wiring W1 and is connected in cascade to the partial electrode BA23 on the other side through the second layer wiring W2. The partial electrode BA22 is connected in cascade to the partial electrode BA24 on one side through the first layer wiring W1 and is connected in cascade to the partial electrode BA24 on the other side through the second layer wiring W2.

The partial electrode BC21 is connected in cascade to the partial electrode BC22 on one side through the first layer wiring W1 and is connected in cascade to the partial electrode BC24 on the other side through the second layer wiring W2. The partial electrode BC23 is connected in cascade to the partial electrode BC24 on one side through the first layer wiring W1 and is connected in cascade to the partial electrode BC22 on the other side through the second layer wiring W2.

The partial electrode BB21 is connected in cascade to the partial electrode BB22 on one side through the first layer wiring W1 and is connected in cascade to the partial electrode BB24 on the other side through the second layer wiring W2. The partial electrode BB23 is connected in cascade to the partial electrode BB24 on one side through the first layer wiring W1 and is connected in cascade to the partial electrode BB22 on the other side through the second layer wiring W2.

As described above, also in the capacitive sensor 11 according to the present embodiment, the number of vias VH used for a single detection electrode E in a single section A is only one. It is therefore possible to reduce the number of vias used without increasing the number of inner layers, as in the capacitive sensor 11 according to the first embodiment.

Third Embodiment

Next, a third embodiment of the present invention is described. In the first embodiment and the second embodiment described above, a partial electrode group G in each section A is constituted by three partial electrodes B. Meanwhile, in a capacitive sensor 11 according to the present embodiment, a partial electrode group G in each section A is constituted by four partial electrodes B.

Figure 10:
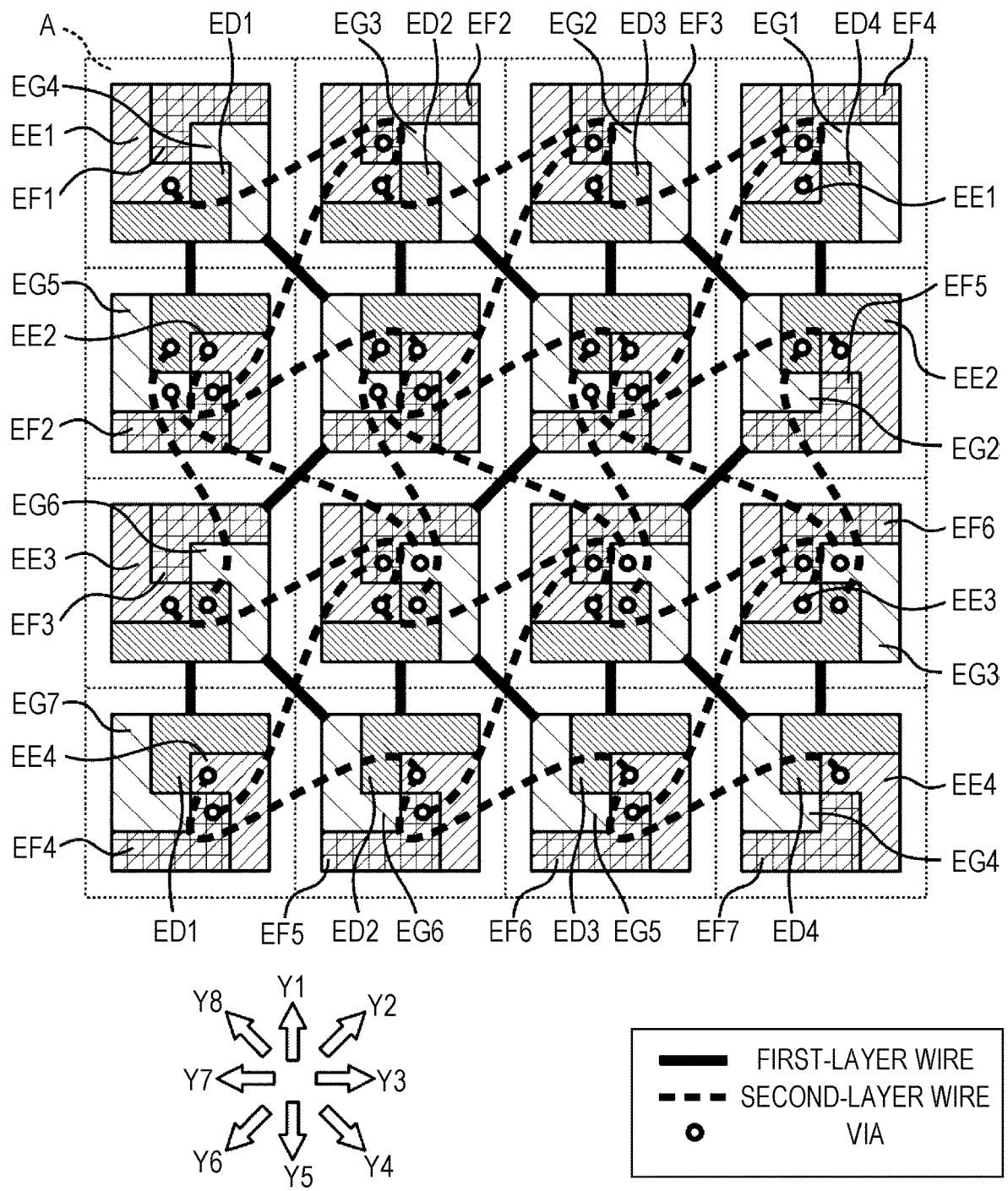
FIG. 10 illustrates an example of a structure of a capacitive sensor according to a third embodiment.

FIG. 10 illustrates an example of a structure of the capacitive sensor 11 according to the third embodiment. FIGS. 11A and 11B and FIGS. 12A and 12B illustrate a structure of the capacitive sensor 11 illustrated in FIG. 10 for respective detection electrode groups. The capacitive sensor 11 illustrated in FIG. 10 is configured such that a region AR is divided in a grid manner by square sections A. Detection electrodes E are divided into four detection electrode groups "ED1 through ED4", "EE1 through EE4", "EF1 through EF7", and "EG1 through EG7" in accordance with extension directions.

In FIG. 10, FIGS. 11A and 11B, and FIGS. 12A and 12B, "Y1" through "Y8" represent directions of eight adjacent sections A around a single section A. In plan view, "Y1" through "Y8" are arranged in this order in a certain direction (a clockwise direction on the paper in the example of FIG. 10, FIGS. 11A and 11B, and FIGS. 12A and 12B). In the detection electrode group constituted by the detection electrodes ED1 through ED4, each detection electrode extends from an Y5-side section A to an Y1-side section A. In the detection electrode group constituted by the detection electrodes EE1 through EE4, each detection electrode extends from an Y7-side section A to an Y3-side section A. In the detection electrode group constituted by the detection electrodes EF1 through EF7, each detection electrode extends from an Y6-side section A to an Y2-side section A. In the detection electrode group constituted by the detection electrodes EG1 through EG7, each detection electrode extends from an Y8-side section A to an Y4-side section A. Hereinafter, each of the detection electrodes ED1 through ED4 is sometimes referred to as a "detection electrode ED", each of the detection electrodes EE1 through EE4 is sometimes referred to as a "detection electrode EE", each of the detection electrodes EF1 through EF7 is sometimes referred to as a "detection electrode EF", and each of the detection electrodes EG1 through EG7 is sometimes referred to as a "detection electrode EG".

As is clear from FIG. 10, there are two kinds of partial electrode groups located in a single section A. FIGS. 13A and 13B illustrate two kinds of partial electrode groups G31 and G32 in the capacitive sensor 11 illustrated in FIG. 10, respectively.

The partial electrode group G31 illustrated in FIG. 13A has four partial electrodes (BD31, BE31, BF31, and BG31). The partial electrodes BD31, BE31, BF31, and BG31 are included in the detection electrodes ED, EE, EF, and EG, respectively. The partial electrodes BD31, BE31, BF31, and BG31 are arranged in this order in a clockwise direction along an outer circumference of the partial electrode group G31 that faces surrounding sections A. Each of these four partial electrodes has a shape similar to "L", and the shapes of the four partial electrodes are rotationally symmetric (two-fold symmetric or four-fold symmetric) with one another. That is, in a case where any pair of two partial electrodes is selected from the four partial electrodes and one of the partial electrodes is rotated by 90 degrees or 180 degrees about a center of a square section A, the rotated partial electrode matches the other partial electrode.

The partial electrode group G32 illustrated in FIG. 13B has four partial electrodes (BD32, BE32, BF32, and BG32). The partial electrodes BD32, BE32, BF32, and BG32 are included in the detection electrodes ED, EE, EF, and EG, respectively. The partial electrodes BD32, BE32, BF32, and BG32 are arranged in this order in a clockwise direction along an outer circumference of the partial electrode group G32 that faces surrounding sections A. These four partial electrodes have a shape similar to the shape of the partial electrodes (BD31, BE31, BF31, and BG31) of the partial electrode group G31.

The partial electrode groups G32, G32, G31, G32, G32, G32, G31, and G32 are located around the partial electrode group G31 in an order of the direction Y1 to the direction Y8. The partial electrode groups G31, G31, G32, G31, G31, G31, G32, and G31 are located around the partial electrode group G32 in the order of the direction Y1 to the direction Y8.

The partial electrode BD31 is connected in cascade to the partial electrode BD32 on one side through the first layer wiring W1 and is connected in cascade to the partial electrode BD32 on the other side through the second layer wiring W2. The partial electrode BF31 is connected in cascade to the partial electrode BF32 on one side through the first layer wiring W1 and is connected in cascade to the partial electrode BF32 on the other side through the second layer wiring W2. The partial electrode BG31 is connected in cascade to the partial electrode BG32 on one side through the first layer wiring W1 and is connected in cascade to the partial electrode BG32 on the other side through the second layer wiring W2. The partial electrode BE31 is connected in cascade to the partial electrodes BE31 on both sides through the second layer wiring W2. The partial electrode BE32 is connected in cascade to the partial electrodes BE32 on both sides through the second layer wiring W2. The partial electrodes BD31, BD32, BF31, BF32, BG31, and BG32 are second partial electrodes, and the partial electrodes BE31 and BE32 are first partial electrodes.

As described above, also in the present embodiment in which the number of partial electrodes B included in the partial electrode group G increases from 3 to 4, the number of vias VH used for a single detection electrode E in a single section A is only one. It is therefore possible to reduce the number of vias used without increasing the number of inner layers.

Fourth Embodiment

Next, a fourth embodiment of the present invention is described. A capacitive sensor 11 according to the present embodiment is different from the capacitive sensor 11 illustrated in FIG. 10 in a configuration and a wiring pattern of partial electrode groups and is basically identical to the capacitive sensor 11 illustrated in FIG. 10 in other main constituents.

Figure 14:
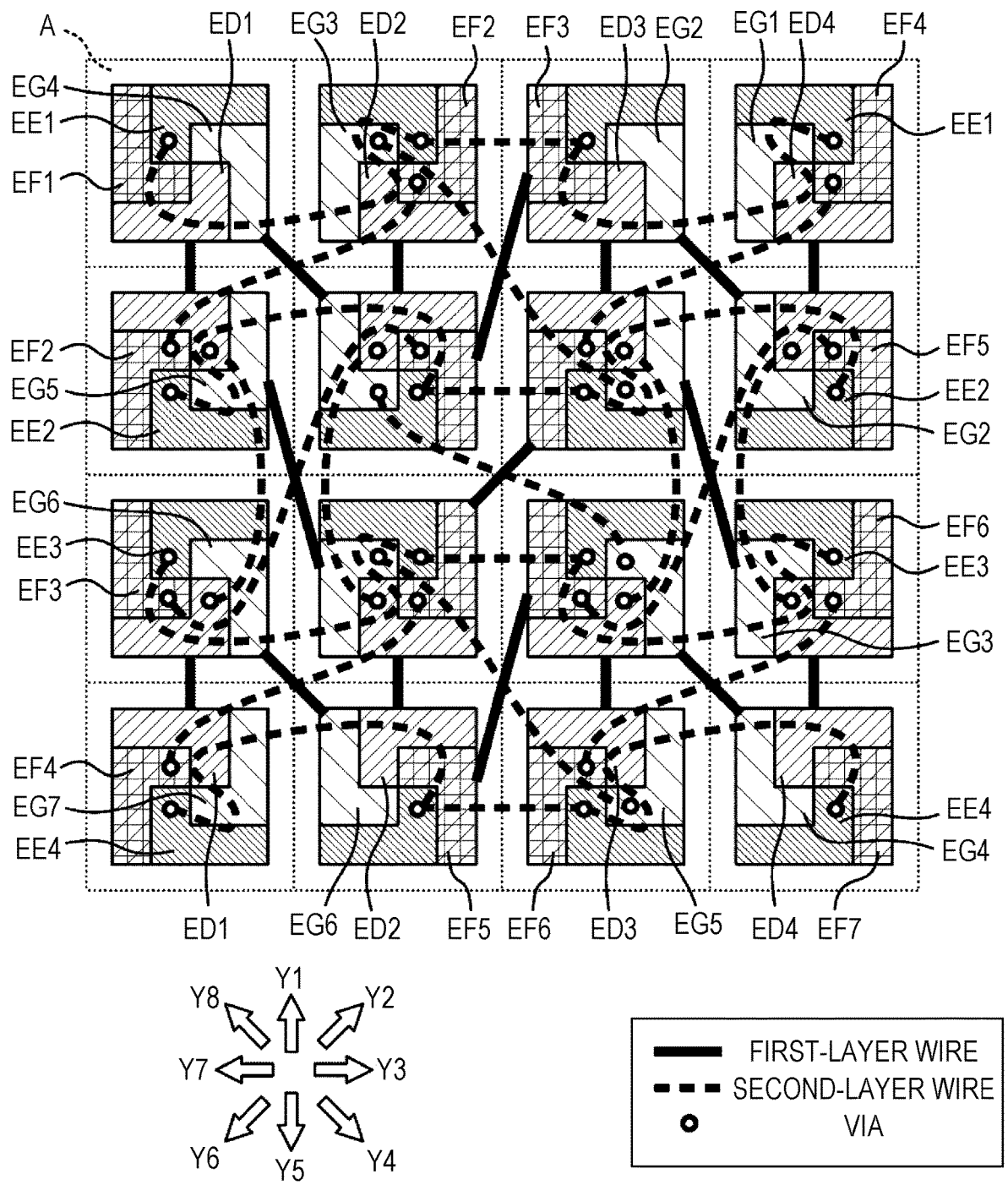
FIG. 14 illustrates an example of a structure of a capacitive sensor according to a fourth embodiment.

FIG. 14 illustrates an example of a configuration of the capacitive sensor 11 according to the fourth embodiment. FIGS. 15A and 15B and FIGS. 16A and 16B illustrates a structure of the capacitive sensor 11 illustrated in FIG. 14 for respective detection electrode groups. As is clear from FIG. 14, there are four kinds of partial electrode groups located in a single section A. FIGS. 17A through 17D illustrate four kinds of partial electrode groups G41 through G44 in the capacitive sensor 11 illustrated in FIG. 14, respectively.

The partial electrode group G41 illustrated in FIG. 17A has four partial electrodes (BD41, BE41, BF41, and BG41). The partial electrodes BD41, BE41, BF41, and BG41 are included in detection electrodes ED, EE, EF, and EG, respectively. The partial electrodes BD41, BF41, BE41, and BG41 are arranged in this order in a clockwise direction along an outer circumference of the partial electrode group G41 that faces surrounding sections A. The four partial electrodes of the partial electrode group G41 have a shape similar to the shape of the partial electrodes of FIGS. 13A and 13B.

The partial electrode group G42 illustrated in FIG. 17B has four partial electrodes (BD42, BE42, BF42, and BG42). The partial electrodes BD42, BE42, BF42, and BG42 are included in the detection electrodes ED, EE, EF, and EG, respectively. The partial electrodes BD42, BG42, BE42, and BF42 are arranged in this order in a clockwise direction along an outer circumference of the partial electrode group G42 that faces surrounding sections A. The four partial electrodes of the partial electrode group G42 have a shape similar to the shape of the partial electrodes of FIGS. 13A and 13B.

The partial electrode group G43 illustrated in FIG. 17C have four partial electrodes (BD43, BE43, BF43, and BG43). The partial electrodes BD43, BE43, BF43, and BG43 are included in the detection electrodes ED, EE, EF, and EG, respectively. The partial electrodes BD43, BG43, BE43, and BF43 are arranged in this order in a clockwise direction along an outer circumference of the partial electrode group G43 that faces surrounding sections A. The four partial electrodes of the partial electrode group G43 have a shape similar to the shape of the partial electrodes of FIGS. 13A and 13B.

The partial electrode group G44 illustrated in FIG. 17D has four partial electrodes (BD44, BE44, BF44, and BG44). The partial electrodes BD44, BE44, BF44, and BG44 are included in the detection electrodes ED, EE, EF, and EG, respectively. The partial electrodes BD44, BF44, BE44, and BG44 are arranged in this order in a clockwise direction along an outer circumference of the partial electrode group G44 that faces surrounding sections A. The four partial electrodes of the partial electrode group G44 have a shape similar to the shape of the partial electrodes of FIGS. 13A and 13B.

The partial electrode groups G43, G44, G42, G44, G43, G44, G42, and G44 are located around the partial electrode group G41 in an order of a direction Y1 to a direction Y8. The partial electrode groups G44, G43, G41, G43, G44, G43, G41, and G43 are located around the partial electrode group G42 in the order of the direction Y1 to the direction Y8. The partial electrode groups G41, G42, G44, G42, G41, G42, G44, and G42 are located around the partial electrode group G43 in the order of the direction Y1 to the direction Y8. The partial electrode groups G42, G41, G43, G41, G42, G41, G43, and G41 are located around the partial electrode group G44 in the order of the direction Y1 to the direction Y8.

The partial electrode BD41 is connected in cascade to the partial electrode BD43 on one side through the first layer wiring W1 and is connected in cascade to the partial electrode BD43 on the other side through the second layer wiring W2. The partial electrode BD42 is connected in cascade to the partial electrode BD44 on one side through the first layer wiring W1 and is connected in cascade to the partial electrode BD44 on the other side through the second layer wiring W2.

The partial electrode BF41 is connected in cascade to the partial electrode BF44 on one side through the first layer wiring W1 and is connected in cascade to the partial electrode BF44 on the other side through the second layer wiring W2. The partial electrode BF42 is connected in cascade to the partial electrode BF43 on one side through the first layer wiring W1 and is connected in cascade to the partial electrode BF43 on the other side through the second layer wiring W2.

The partial electrode BG41 is connected in cascade to the partial electrode BG44 on one side through the first layer wiring W1 and is connected in cascade to the partial electrode BG44 on the other side through the second layer wiring W2. The partial electrode BG42 is connected in cascade to the partial electrode BG43 on one side through the first layer wiring W1 and is connected in cascade to the partial electrode BG43 on the other side through the second layer wiring W2.

The partial electrode BE41 is connected in cascade to the partial electrodes BF42 on both sides through the second layer wiring W2 and the partial electrode BF43 is connected in cascade to the partial electrodes BE44 on both sides through the second layer wiring W2.

The partial electrodes BD41 through BD44, BF41 through BF44, and BG41 through BG44 are second partial electrodes, and the partial electrodes BE41 through BE44 are first partial electrodes.

Figure 18A:
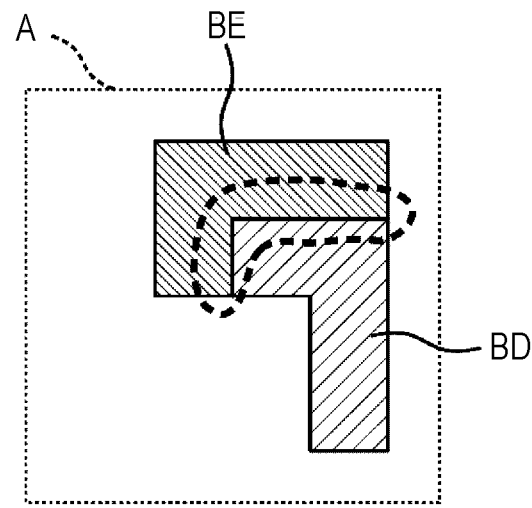
FIGS. 18A and 18B are views for explaining a difference in distribution of sensitivity that depends on a layout of two partial electrodes.
Figure 18B:
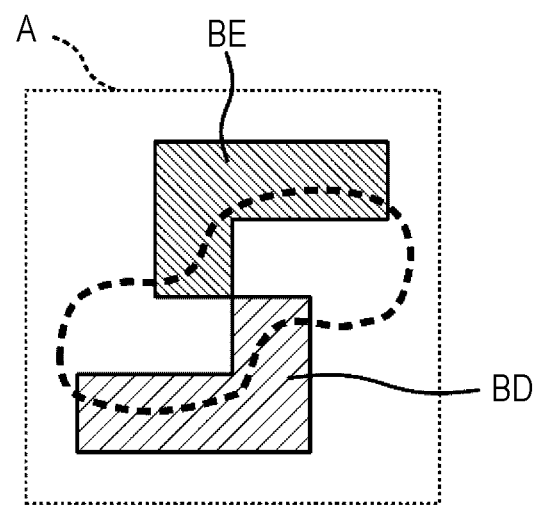

FIGS. 18A and 18B are views for explaining a difference in distribution of sensitivity that depends on a layout of two partial electrodes. "BD" indicates a partial electrode included in the detection electrode ED extending in a longitudinal direction, and "BE" indicates a partial electrode included in the detection electrode EE that extends in a lateral direction. FIG. 18A illustrates a layout of the partial electrodes BE and BD in the capacitive sensor 11 illustrated in FIG. 10, and the partial electrodes BE and BD are disposed asymmetrically in relation to the square section A. If mutual capacitance type electrostatic capacitance detection is performed by using the detection electrode ED and the detection electrode EE that are orthogonal to each other, sensitivity of measurement of mutual capacitance becomes high in the vicinity of a gap between the electrodes indicated by the dotted line in FIG. 18A. In a case where the partial electrodes BE and BD are disposed as illustrated in FIG. 18A, as a distribution of sensitivity of measurement of mutual capacitance is deviated from a center of the section A, deviation of an actual position of an object from a measurement result is more likely to occur.

Meanwhile, FIG. 18B illustrates a layout of the partial electrodes BE and BD in the capacitive sensor 11 illustrated in FIG. 14, and the partial electrodes BE and BD are disposed substantially symmetrically in relation to the square section A. As indicated by the dotted line in FIG. 18B, in a case where the partial electrodes BE and BD are disposed as illustrated in FIG. 18B, a distribution of sensitivity of measurement of mutual capacitance substantially matches the center of the section A. According to the capacitive sensor illustrated in FIG. 14, it is therefore possible to reduce an error in measurement result in a case where mutual capacitance type electrostatic capacitance detection is performed.

Also in the capacitive sensor according to the present embodiment, the number of vias VH used for a single detection electrode E in a single section A is only one, and therefore it is possible to reduce the number of vias used without increasing the number of inner layers.

Fifth Embodiment

Next, a fifth embodiment of the present invention is described. A capacitive sensor 11 according to the present embodiment is different from the capacitive sensors 11 according to the third embodiment (FIG. 10) and the fourth embodiment (FIG. 14) in a configuration and a wiring pattern of partial electrode groups and a shape of partial electrodes and is basically identical to the capacitive sensors 11 according to these embodiments in other main constituents.

FIG. 19 illustrates an example of a structure of the capacitive sensor 11 according to the fifth embodiment. FIGS. 20A and 20B and FIGS. 21A and 21B illustrate a structure of the capacitive sensor 11 illustrated in FIG. 19 for respective detection electrode groups. As is clear from FIG. 19, there are four kinds of partial electrode groups located in a single section A. FIGS. 22A through 22D illustrate four kinds of partial electrode groups G51 through G54 in the capacitive sensor 11 illustrated in FIG. 19, respectively.

The partial electrode group G51 illustrated in FIG. 22A has four partial electrodes (BD51, BE51, BF51, and BG51). The partial electrodes BD51, BE51, BF51, and BG51 are included in the detection electrodes ED, EE, EF, and EG, respectively. The partial electrodes BD51, BE51, BG51, and BF51 are arranged in this order in a clockwise direction along an outer circumference of the partial electrode group G51 that faces surrounding sections A. Each of these four partial electrodes has a shape similar to "J", and the shapes of the four partial electrodes are rotationally symmetric (two-fold symmetric or four-fold symmetric) with one another. That is, in a case where any pair of two partial electrodes is selected from the four partial electrodes and one of the partial electrodes is rotated by 90 degrees or 180 degrees about a center of a square section A, the rotated partial electrode matches the other partial electrode.

The partial electrode group G52 illustrated in FIG. 22B has four partial electrodes (BD52, BE52, BF52, and BG52). The partial electrodes BD52, BE52, BF52, and BG52 are included in the detection electrodes ED, EE, EF, and EG, respectively. The partial electrodes BD52, BF52, BE52, and BG52 are arranged in this order in a clockwise direction along an outer circumference of the partial electrode group G52 that faces surrounding sections A. The four partial electrodes of the partial electrode group G52 have a shape similar to the shape of the partial electrodes (BD51, BE51, BF51, and BG51) of the partial electrode group G51.

The partial electrode group G53 illustrated in FIG. 22C has four partial electrodes (BD53, BE53, BF53, and BG53). The partial electrodes BD53, BE53, BF53, and BG53 are included in the detection electrodes ED, EE, EF, and EG, respectively. The partial electrodes BD53, BF53, BE53, and BG53 are arranged in this order in a clockwise direction along an outer circumference of the partial electrode group G53 that faces surrounding sections A. The four partial electrodes of the partial electrode group G53 have a shape similar to the shape of the partial electrodes (BD51, BE51, BF51, and BG51) of the partial electrode group G51.

The partial electrode group G54 illustrated in FIG. 22D has four partial electrodes (BD54, BE54, BF54, and BG54). The partial electrodes BD54, BE54, BF54, and BG54 are included in the detection electrodes ED, EE, EF, and EG, respectively. The partial electrodes BD54, BG54, BF54, and BE54 are arranged in this order in a clockwise direction along an outer circumference of the partial electrode group G54 that faces surrounding sections A. The four partial electrodes of the partial electrode group G54 have a shape similar to the shape of the partial electrodes (BD51, BE51, BF51, and BG51) of the partial electrode group G51.

The partial electrode groups G53, G54, G52, G54, G53, G54, G52, and G54 are located around the partial electrode group G51 in an order of a direction Y1 to a direction Y8. The partial electrode groups G54, G53, G51, G53, G54, G53, G51, and G53 are located around the partial electrode group G52 in the order of the direction Y1 to the direction Y8. The partial electrode groups G51, G52, G54, G52, G51, G52, G54, and G52 are located around the partial electrode group G53 in the order of the direction Y1 to the direction Y8. The partial electrode groups G52, G51, G53, G51, G52, G51, G53, and G51 are located around the partial electrode group G54 in the order of the direction Y1 to the direction Y8.

The partial electrode BD51 is connected in cascade to the partial electrode BD53 on one side through the first layer wiring W1 and is connected in cascade to the partial electrode BD53 on the other side through the second layer wiring W2. The partial electrode BD52 is connected in cascade to the partial electrode BD54 on one side through the first layer wiring W1 and is connected in cascade to the partial electrode BD54 on the other side through the second layer wiring W2.

The partial electrode BE51 is connected in cascade to the partial electrode BE52 on one side through the first layer wiring W1 and is connected in cascade to the partial electrode BE52 on the other side through the second layer wiring W2. The partial electrode BE53 is connected in cascade to the partial electrode BE54 on one side through the first layer wiring W1 and is connected in cascade to the partial electrode BE54 on the other side through the second layer wiring W2.

The partial electrode BF51 is connected in cascade to the partial electrode BF54 on one side through the first layer wiring W1 and is connected in cascade to the partial electrode BF54 on the other side through the second layer wiring W2. The partial electrode BF52 is connected in cascade to the partial electrode BF53 on one side through the first layer wiring W1 and is connected in cascade to the partial electrode BF53 on the other side through the second layer wiring W2.

The partial electrode BG51 is connected in cascade to the partial electrode BG54 on one side through the first layer wiring W1 and is connected in cascade to the partial electrode BG54 on the other side through the second layer wiring W2. The partial electrode BG52 is connected in cascade to the partial electrode BG53 on one side through the first layer wiring W1 and is connected in cascade to the partial electrode BG53 on the other side through the second layer wiring W2.

As described above, also in the capacitive sensor 11 according to the present embodiment, the number of vias VH used for a single detection electrode E in a single section A is only one, and therefore it is possible to reduce the number of vias used without increasing the number of inner layers as in the third embodiment and the fourth embodiment.

Sixth Embodiment

Next, a sixth embodiment of the present invention is described. In the embodiments described so far, all detection electrodes E are wired by using both of the first layer wiring W1 and the second layer wiring W2 or only the second layer wiring W2. Meanwhile, in a capacitive sensor according to the present embodiment, some detection electrodes E are wired without a via by using only the first layer wiring W1.

A configuration of the present embodiment is similar to the configurations of the third through fifth embodiments in terms of a shape of a section A, a configuration of detection electrode groups, and the like and is different from the configurations of the third through fifth embodiments in terms of a configuration and a wiring pattern of a partial electrode group in each section A and a shape of partial electrodes. The following basically describes differences from the embodiments described so far.

Figure 23:
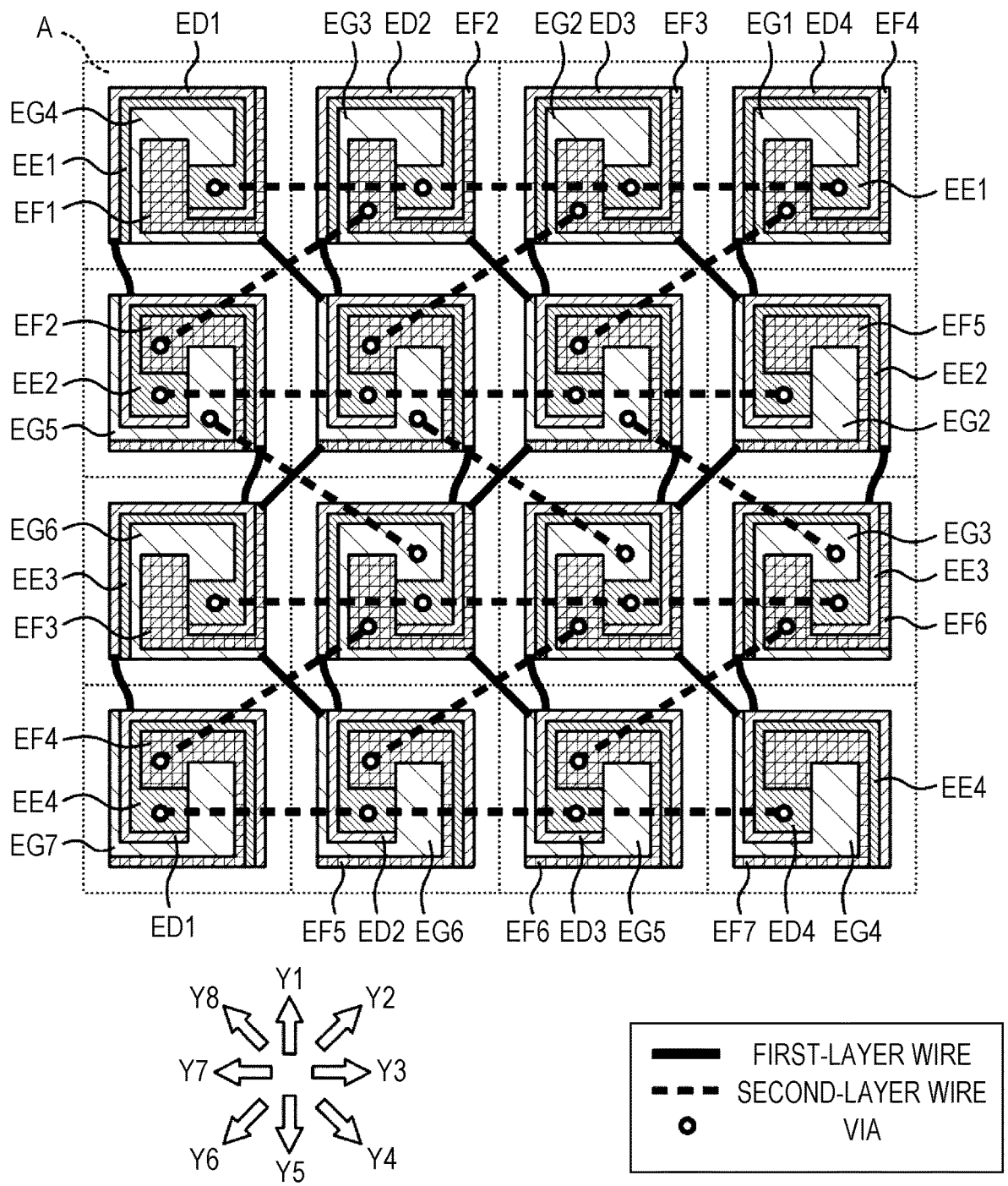
FIG. 23 illustrates an example of a structure of a capacitive sensor according to a sixth embodiment.

FIG. 23 illustrates an example of a structure of a capacitive sensor 11 according to the sixth embodiment. FIGS. 24A and 24B and FIGS. 25A and 25B illustrate the structure of the capacitive sensor 11 illustrated in FIG. 23 for respective detection electrode groups. As is clear from FIG. 23, there are two kinds of partial electrode groups located in a single section A. FIGS. 26A and 26B illustrate two kinds of partial electrode groups G61 and G62 in the capacitive sensor 11 illustrated in FIG. 23.

The partial electrode group G61 illustrated in FIG. 26A has four partial electrodes (BD61, BE61, BF61, and BG61). The partial electrodes BD61, BE61, BF61, and BG61 are included in the detection electrodes ED, EE, EF, and EG, respectively. The partial electrodes BD61, BE61, BF61, and BG61 are arranged in this order in a clockwise direction along an outer circumference of the partial electrode group G61 that faces surrounding sections A. Each of these four partial electrodes has a spiral shape winding toward a center of the section A as a whole, and the shapes of the four partial electrodes are different from one another and are not symmetric with one another unlike the embodiments described so far.

The partial electrode group G62 illustrated in FIG. 26B has four partial electrodes (BD62, BE62, BF62, and BG62). The partial electrodes BD62, BE62, BF62, and BG62 are included in the detection electrodes ED, EE, EF, and EG, respectively. The partial electrodes BD62, BF62, BG62, and BE62 are arranged in this order in a clockwise direction along an outer circumference of the partial electrode group G62 that faces surrounding sections A. Each of these four partial electrodes of the partial electrode group G62 has a spiral shape winding toward a center of the section A as a whole, and the shapes of the four partial electrodes are different from one another and asymmetric with one another as in the partial electrode group G61.

The partial electrode groups G62, G62, G61, G62, G62, G62, G61, and G62 are located around the partial electrode group G61 in an order of a direction Y1 to a direction Y8. The partial electrode groups G61, G61, G62, G61, G61, G61, G62, and G61 are located around the partial electrode group G62 in the order of the direction Y1 to the direction Y8.

The partial electrode BF61 is connected in cascade to the partial electrode BF62 on one side through the first layer wiring W1 and is connected in cascade to the partial electrode BF62 on the other side through the second layer wiring W2.

The partial electrode BG61 is connected in cascade to the partial electrode BG62 on one side through the first layer wiring W1 and is connected in cascade to the partial electrode BG62 on the other side through the second layer wiring W2.

The partial electrode BE61 is connected in cascade to the partial electrodes BE61 on both sides through the second layer wiring W2. The partial electrode BE62 is connected in cascade to the partial electrodes BE62 on both sides through the second layer wiring W2.

As is clear from these connection relationships, the partial electrodes BE61 and BE62 are first partial electrodes, and the partial electrodes BF61, BF62, BG61, and BG62 are second partial electrodes.

Meanwhile, the partial electrode BD61 is connected in cascade to the partial electrodes BD62 on both sides through the first layer wiring W1. The partial electrodes BD61 and BD62 correspond to third partial electrodes according to the present invention. According to the present embodiment, as the number of vias for wiring leading to the third partial electrodes (the partial electrodes BD61 and BD62) is zero, the number of vias VH is smaller by one than that in the above embodiments.

Seventh Embodiment

Figure 27:
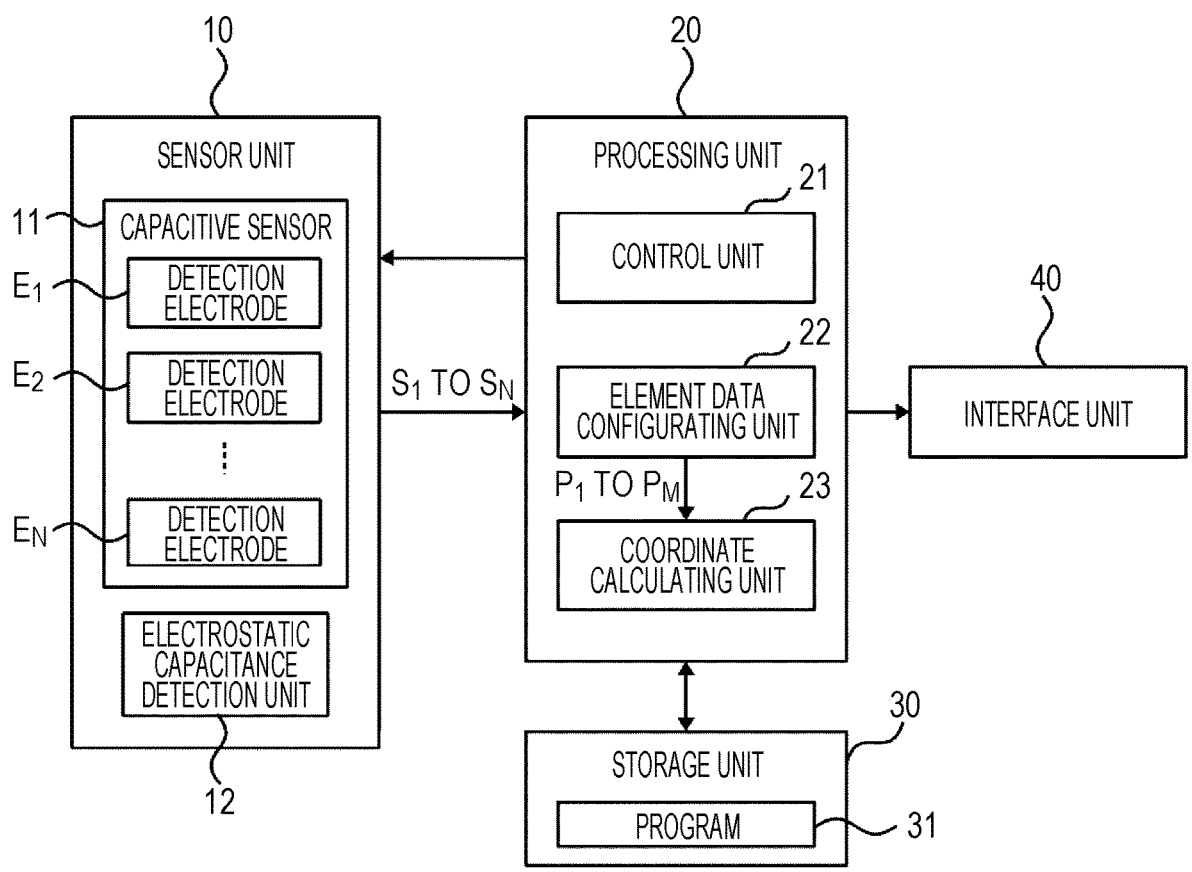
FIG. 27 is a diagram illustrating an example of a configuration of an input device according to a seventh embodiment.

FIG. 27 is a diagram illustrating an example of a configuration of an input device according to a seventh embodiment of the present invention.

The input device illustrated in FIG. 27 includes a sensor unit 10, a processing unit 20, a storage unit 30, and an interface unit 40. The input device according to the present embodiment is a device for inputting information corresponding to a position of proximity of an object such as a finger or a pen to an operation surface on which a sensor is provided. Note that "proximity" means being close and encompasses both of a contact state and a non-contact state.

Sensor Unit 10

The sensor unit 10 includes the capacitive sensor 11 described in any of the above embodiments. The sensor unit 10 detects a degree of proximity of an object (e.g., a finger or a pen) in each of N detection electrodes $E_1$ through $E_N$ and generate N pieces of detection data $S_1$ through $S_N$ as a whole. The sensor unit 10 generates a single piece of detection data $S_i$ for each of the detection electrodes $E_1$ through $E_N$. Note that i represents an integer from 1 to N. Hereinafter, the N pieces of detection data $S_1$ through $S_N$ are sometimes collectively referred to as "detection data S". Furthermore, the N detection electrodes $E_1$ through $E_N$ are sometimes collectively referred to as a "detection electrode E".

Furthermore, the sensor unit 10 includes an electrostatic capacitance detection unit 12 that generates detection data S in accordance with an electrostatic capacitance (first electrostatic capacitance) between an object located in proximity to an operation surface of the capacitive sensor 11 (hereinafter referred to as the "operation surface 11") and the detection electrode E. The electrostatic capacitance detection unit 12 is connected to each of the N detection electrodes E through extraction wiring (not illustrated) and generates detection data S for each of the detection electrodes E.

The electrostatic capacitance detection unit 12 samples an electric charge according to an electrostatic capacitance of a capacitor formed between each of the N detection electrodes E and an object and outputs detection data S according to the sampled electric charge. The electrostatic capacitance detection unit 12 includes, for example, an electrostatic capacitance-voltage conversion circuit (CV conversion circuit) and an A/D conversion circuit. The CV conversion circuit charges or discharges the capacitor formed between each of the N detection electrodes E and the object under control of the processing unit 20, transfers an electric charge of the capacitor transmitted through the detection electrode E as a result of the charge or discharge to a capacitor for reference, and outputs a signal corresponding to a voltage that is generated in the capacitor for reference. The A/D conversion circuit converts an output signal of the CV conversion circuit into a digital signal on a predetermined cycle under control of the processing unit 20 and outputs the digital signal as detection data S. Hereinafter, detection data of electrostatic capacitance of a detection electrode $E_i$ is referred to as "$S_i$".

In the present embodiment, the number M of sections A is larger than the number N of detection electrodes E (M>N). Hereinafter, the sections A are sometimes referred to as "sections $A_j$" so as to be distinguished from one another. Note that "j" represents an integer of 1 to M.

The input device according to the present embodiment configures M pieces of element data $P_1$ through $P_M$ indicative of degrees of proximity of the object in each of the M sections $A_1$ through $A_M$ on the basis of the N pieces of detection data $S_1$ through $S_N$. Hereinafter, the M pieces of element data $P_1$ through $P_M$ are sometimes collectively referred to as "element data P".

A certain relationship is established between the M pieces of element data $P_1$ through $P_M$ and the N pieces of detection data $S_1$ through $S_N$. That is, each of the M pieces of element data $P_1$ through $P_M$ is expressed as a sum of partial element data U distributed to the respective N pieces of detection data $S_1$ through $S_N$ at predetermined proportions. When partial element data U distributed from element data $P_j$ to detection data $S_i$ is "$U_{ij}$", the element data $P_j$ is expressed by the following formula.

$$P_j = \sum_{i=1}^{N} U_{ij} \tag{1}$$

A single piece of partial element data $U_{ij}$ is approximate to electrostatic capacitance CE (second electrostatic capacitance, FIG. 1B) between a partial electrode B of a single detection electrode $E_i$ located in a single section $A_j$ and the object. A single piece of element data $P_j$ is approximate to electrostatic capacitance (third electrostatic capacitance) obtained by summing up all second electrostatic capacitances CE in a single section A.

Each of the N pieces of detection data $S_1$ through $S_N$ is approximate to a sum of partial element data $U_{ij}$ distributed from the M pieces of element data $P_1$ through $P_M$ at predetermined proportions. The detection data $S_i$ is expressed by the following formula.

$$S_i = \sum_{j=1}^{M} U_{ij} \tag{2}$$

FIG. 28 illustrates a relationship between the N pieces of detection data $S_1$ through $S_N$ and the M pieces of element data $P_1$ through $P_M$ and illustrates a relationship between the formula (1) and the formula (2). As is clear from FIG. 28, detection data $S_i$ is approximate to a value obtained by summing up partial element data $U_{i1}$ through $U_{iM}$ distributed from the M pieces of element data $P_1$ through $P_M$. Accordingly, detection data $S_i$ can also be calculated according to the formula (2) as long as the partial element data $U_{i1}$ through $U_{iM}$ can be calculated from the element data $P_1$ through $P_M$.

In the input device according to the present embodiment, it is assumed that a proportion of partial element data $U_{ij}$ distributed to a single piece of detection data $S_i$ in a single piece of element data $P_j$ is constant. When this predetermined proportion is "constant data $K_{ij}$", the constant data $K_{ij}$ is expressed by the following formula.

$$K_{ij} = \frac{U_{ij}}{P_j} \tag{3}$$

The constant data $K_{ij}$ corresponds to an area ratio of a partial electrode B of a single detection electrode $E_i$ located in a section $A_j$ to all partial electrodes B located in the section $A_j$.

By substituting the partial element data $U_{ij}$ derived from the formula (3) into the formula (2), the detection data $S_i$ is expressed by the following formula.

$$S_i = \sum_{j=1}^{M} K_{ij} P_j \tag{4}$$

FIG. 29 is a view for explaining conversion from the M pieces of element data $P_1$ through $P_M$ into the N pieces of detection data $S_1$ through $S_N$. Conversion from the element data $P_1$ through $P_M$ into detection data $S_1$ through $S_N$ expressed by the formula (4) is defined by N×M pieces of constant data $K_{ij}$. This conversion is expressed by the following formula by using a matrix as is clear from FIG. 29.

$$\underbrace{\begin{bmatrix} K_{11} & K_{12} & \cdots & K_{1M} \\ K_{21} & & & K_{2M} \\ \vdots & & & \vdots \\ K_{N1} & K_{N2} & \cdots & K_{NM} \end{bmatrix}}_{K} \begin{bmatrix} P_1 \\ P_2 \\ \vdots \\ P_M \end{bmatrix} = \begin{bmatrix} S_1 \\ S_2 \\ \vdots \\ S_N \end{bmatrix} \tag{5}$$

An N×M matrix (a first conversion matrix K) on the left-hand side of the formula (5) is known data decided by a configuration of the sensor unit 10 such as a combination of layouts of the partial electrodes B in the plurality of sections A and areas of partial electrodes B disposed in each of the sections A.

Processing Unit 20

The processing unit 20 is a circuit that controls overall operation of the input device and is, for example, configured to include a computer that executes processing in accordance with a command code of a program 31 stored in the storage unit 30 and a logic circuit that realizes a specific function. The whole processing of the processing unit 20 may be realized based on a program on the computer or part of or a whole of the processing may be realized by a dedicated logic circuit.

In the example of FIG. 27, the processing unit 20 has a control unit 21, an element data configuring unit 22, and a coordinate calculating unit 23.

The control unit 21 controls a detection timing of the sensor unit 10. For example, the control unit 21 controls each circuit in the sensor unit 10 so that selection of a detection region R in which detection is to be executed, sampling of an analog signal obtained as a detection result, generation of detection data S by A/D conversion, and the like are performed at appropriate timings.

The element data configuring unit 22 configures M pieces of element data $P_1$ through $P_M$ corresponding to the M sections A on the basis of N pieces of detection data generated by the sensor unit 10.

The element data configuring unit 22 converges the M pieces of element data $P_1$ through $P_M$ into certain values by repeating data configuring processing described below a predetermined number of times.

First, the data configuring processing is described.

The element data configuring unit 22 calculates assumed values $SA_1$ through $SA_N$ of N pieces of detection data as sums of partial element data $U_{ij}$ distributed from each of assumed values $PA_1$ through $PA_M$ of M pieces of element data at the predetermined proportions (the constant data $K_{ij}$) in a single data configuring processing. Then, the element data configuring unit 22 modifies the assumed values $PA_1$ through $PA_M$ of the M pieces of element data on the basis of the N×M pieces of constant data $K_{ij}$ so that the calculated assumed values $SA_1$ through $SA_N$ of the N pieces of detection data approach the N pieces of detection data $S_1$ through $S_N$ that are a detection result of the sensor unit 10.

Specifically, this data configuring processing includes four kinds of processing (first through fourth processing).

First Processing

In the first processing, the element data configuring unit 22 converts assumed values $PA_1$ through $PA_M$ of the M pieces of element data into assumed values $SA_1$ through $SA_N$ of the N pieces of detection data on the basis of the N×M pieces of constant data $K_{ij}$ that are known data. This conversion is expressed by the following formula by using the first conversion matrix K on the basis of the relationship of the formula (5).

$$\underbrace{\begin{bmatrix} K_{11} & K_{12} & \cdots & K_{1M} \\ K_{21} & & & K_{2M} \\ \vdots & & & \vdots \\ K_{N1} & K_{n2} & \cdots & K_{NM} \end{bmatrix}}_{K} \begin{bmatrix} PA_1 \\ PA_2 \\ \vdots \\ PA_M \end{bmatrix} = \begin{bmatrix} SA_1 \\ SA_2 \\ \vdots \\ SA_N \end{bmatrix} \quad (6)$$

FIG. 30 is a view for explaining conversion from the assumed values $PA_1$ through $PA_M$ of the M pieces of element data into the assumed values $SA_1$ through $SA_N$ of the N pieces of detection data. Since the first conversion matrix K is known data, the assumed values $SA_1$ through $SA_N$ of the N pieces of detection data can be calculated according to the formula (6) as long as the assumed values $PA_1$ through $PA_M$ of the M pieces of element data are given.

Second Processing

In the second processing, the element data configuring unit 22 calculates N first coefficients $\alpha_1$ through $\alpha_N$ indicative of magnifications to be multiplied with the assumed values $SA_1$ through $SA_N$ of the N pieces of detection data so that the assumed values $SA_1$ through $SA_N$ of the N pieces of detection data become equal to the N pieces of detection data $S_1$ through $S_N$. The first coefficient $\alpha_i$ is expressed by the following formula.

$$\alpha_i = \frac{S_i}{SA_i} \quad (7)$$

Calculation of the first coefficient $\alpha_1$ through $\alpha_N$ in the second processing is expressed by using a matrix as follows.

$$\begin{bmatrix} \alpha_1 \\ \alpha_2 \\ \vdots \\ \alpha_N \end{bmatrix} = \begin{bmatrix} S_1/SA_1 \\ S_2/SA_2 \\ \vdots \\ S_n/SA_N \end{bmatrix} \quad (8)$$

Third Processing

In the third processing, the element data configuring unit 22 calculates M second coefficients $\beta_1$ through $\beta_M$ indicative of magnifications to be multiplied with the assumed values $PA_1$ through $PA_M$ of the M pieces of element data. That is, the element data configuring unit 22 converts the N first coefficients $\alpha_1$ through $\alpha_N$ into the M second coefficients $\beta_1$ through $\beta_M$ on the basis of the N×M pieces of constant data $K_{ij}$.

As indicated by the formula (3), the partial element data $U_{ij}$ distributed from the element data $P_j$ to the detection data $S_i$ occupies a proportion corresponding to the constant data $K_{ij}$ relative to the whole element data $P_j$. As the constant data $K_{ij}$ becomes larger, correlation between the element data $P_j$ and the detection data $S_i$ becomes higher. Accordingly, it is estimated that as the constant data $K_{ij}$ becomes larger, correlation between the first coefficient $\alpha_i$ and the second coefficient $\beta_j$ also becomes higher. In view of this, the element data configuring unit 22 calculates the second coefficient $\beta_j$ not by simply averaging the N first coefficients $\alpha_1$ through $\alpha_N$ but by averaging the N first coefficients $\alpha_1$ through $\alpha_N$ while giving weights of the constant data $K_{ij}$ to each of the first coefficients $\alpha_1$ through $\alpha_N$. That is, the second coefficient $\beta_j$ is expressed by the following formula.

$$\beta_j = \sum_{i=1}^{N} K_{ij} \alpha_i \quad (9)$$

Figure 31:
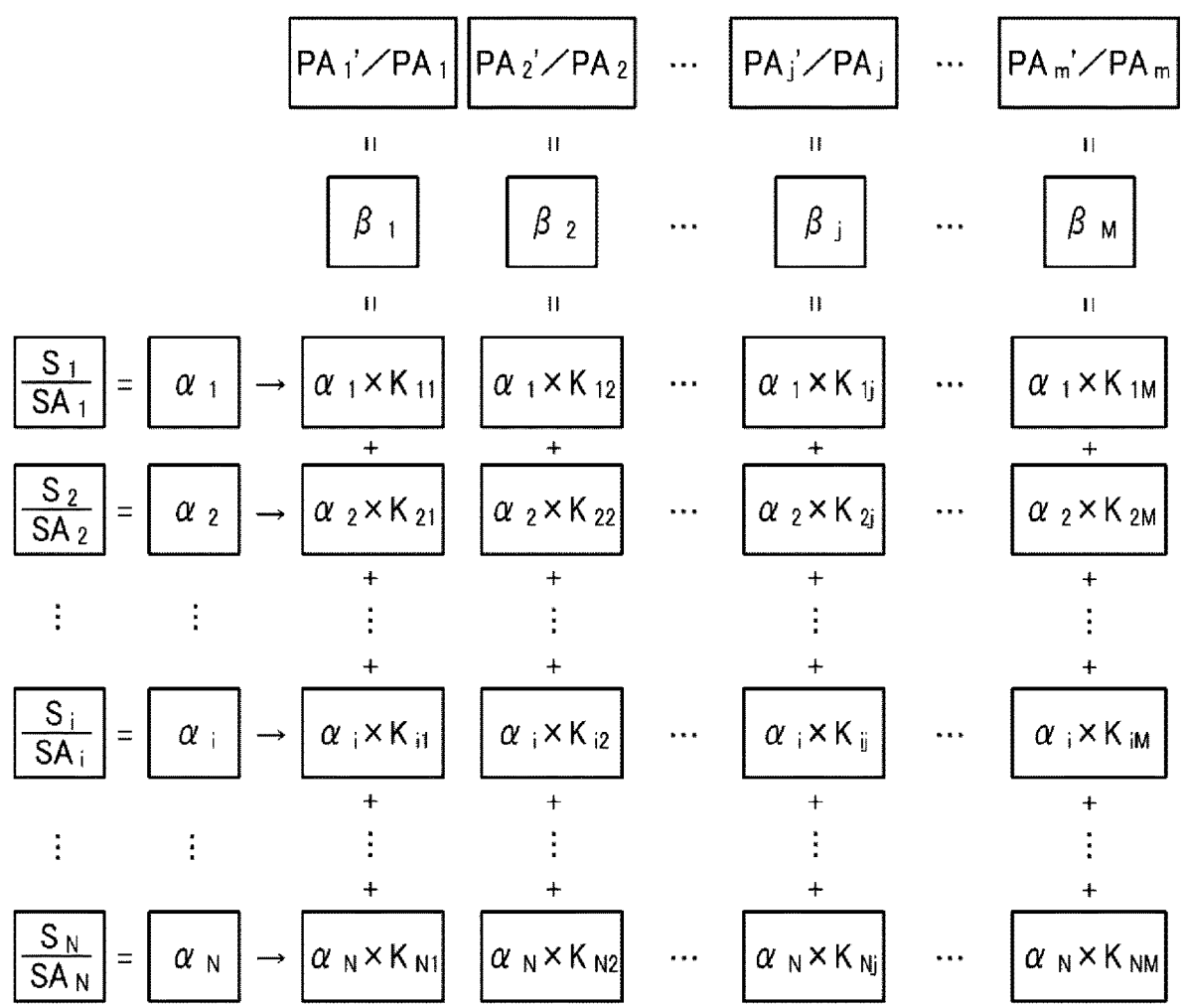
FIG. 31 is a view for explaining conversion from N first coefficients into M second coefficients.

FIG. 31 is a view for explaining conversion from the N first coefficients $\alpha_1$ through $\alpha_N$ into the M second coefficients $\beta_1$ through $\beta_M$. As is clear from FIG. 31, the relationship of the formula (9) is expressed by the following formula using a matrix.

$$\underbrace{\begin{bmatrix} K_{11} & K_{12} & \cdots & K_{1M} \\ K_{21} & & & K_{2M} \\ \vdots & & & \vdots \\ K_{1M} & K_{2M} & \cdots & K_{NM} \end{bmatrix}}_{K^T} \begin{bmatrix} \alpha_1 \\ \alpha_2 \\ \vdots \\ \alpha_N \end{bmatrix} = \begin{bmatrix} \beta_1 \\ \beta_2 \\ \vdots \\ \beta_M \end{bmatrix} \quad (10)$$

An M×N matrix (a second conversion matric $K^T$) on the left-hand side of the formula (10) is a transposed matrix of the first conversion matrix K.

Fourth Processing

In the fourth processing, the element data configuring unit 22 modifies the current assumed values $PA_1$ through $PA_M$ of the element data into new assumed values $PA'_1$ through $PA'_M$ on the basis of the M second coefficients $\beta_1$ through $\beta_M$ obtained in the third processing.

$$PA'_j = \beta_j PA_j \tag{11}$$

Calculation of the assumed values $PA'_1$ through $PA'_M$ of the element data in the fourth processing is expressed by the following formula using a matrix.

$$\begin{bmatrix} PA'_1 \\ PA'_2 \\ \vdots \\ PA'_M \end{bmatrix} = \begin{bmatrix} \beta_1 PA_1 \\ \beta_2 PA_2 \\ \vdots \\ \beta_M PA_M \end{bmatrix} \tag{12}$$

The element data configuring unit 22 acquires the assumed values $PA_1$ through $PA_M$ as configuration results of the element data $P_1$ through $P_M$ by repeating the data configuring processing including the above four kinds processing a predetermined number of times.

The element data configuring unit 22 has been described above.

The coordinate calculating unit 23 calculates coordinates, on the operation surface 11, of a position of proximity of an object (e.g., a finger or a pen) on the basis of the element data $P_1$ through $P_M$ configured by the element data configuring unit 22. For example, the coordinate calculating unit 23 specifies, as a region of proximity of an individual object, a region where data indicative of proximity of the object is gathered by binarizing two-dimensional data expressed by the element data $P_1$ through $P_M$. Then, the coordinate calculating unit 23 creates profile data in a lateral direction and a longitudinal direction of the specified region. The profile data in the lateral direction is data obtained by calculating, for each column, a sum of a group of element data $P_j$ in the longitudinal direction of the operation surface 11 and arranging the sums of the element data $P_j$ in the lateral direction of the operation surface 11. The profile data in the longitudinal direction is data obtained by calculating, for each row, a sum of a group of element data $P_j$ in the lateral direction of the operation surface 11 and arranging the sums of the element data $P_j$ in the longitudinal direction of the operation surface 11. The coordinate calculating unit 23 computes a position of a peak and a center of gravity of the element data $P_j$ for each of the profile data in the lateral direction and the profile data in the longitudinal direction. The position in the lateral direction and the position in the longitudinal direction thus computed represent coordinates of a position of proximity of the object on the operation surface 11. The coordinate calculating unit 23 causes data of the coordinates thus computed to be stored in a predetermined storage area of the storage unit 30.

Storage Unit 30

The storage unit 30 stores therein constant data and variable data used for processing in the processing unit 20. In a case where the processing unit 20 includes a computer, the storage unit 30 may store therein the program 31 executed on the computer. The storage unit 30 includes, for example, a volatile memory such as a DRAM or an SRAM, a non-volatile memory such as a flash memory, and a hard disk.

Interface Unit 40

The interface unit 40 is a circuit for exchanging data between the input device and another control device (e.g., an IC for control of an information apparatus provided with an input device). The processing unit 20 outputs information (e.g., object coordinate information, the number of objects) stored in the storage unit 30 from the interface unit 40 to a control device (not illustrated). The interface unit 40 may acquire the program 31 executed on the computer of the processing unit 20 from a non-transitory recording medium such as a USB memory, a server on a network, or the like and load the program 31 into the storage unit 30.

Figure 32:
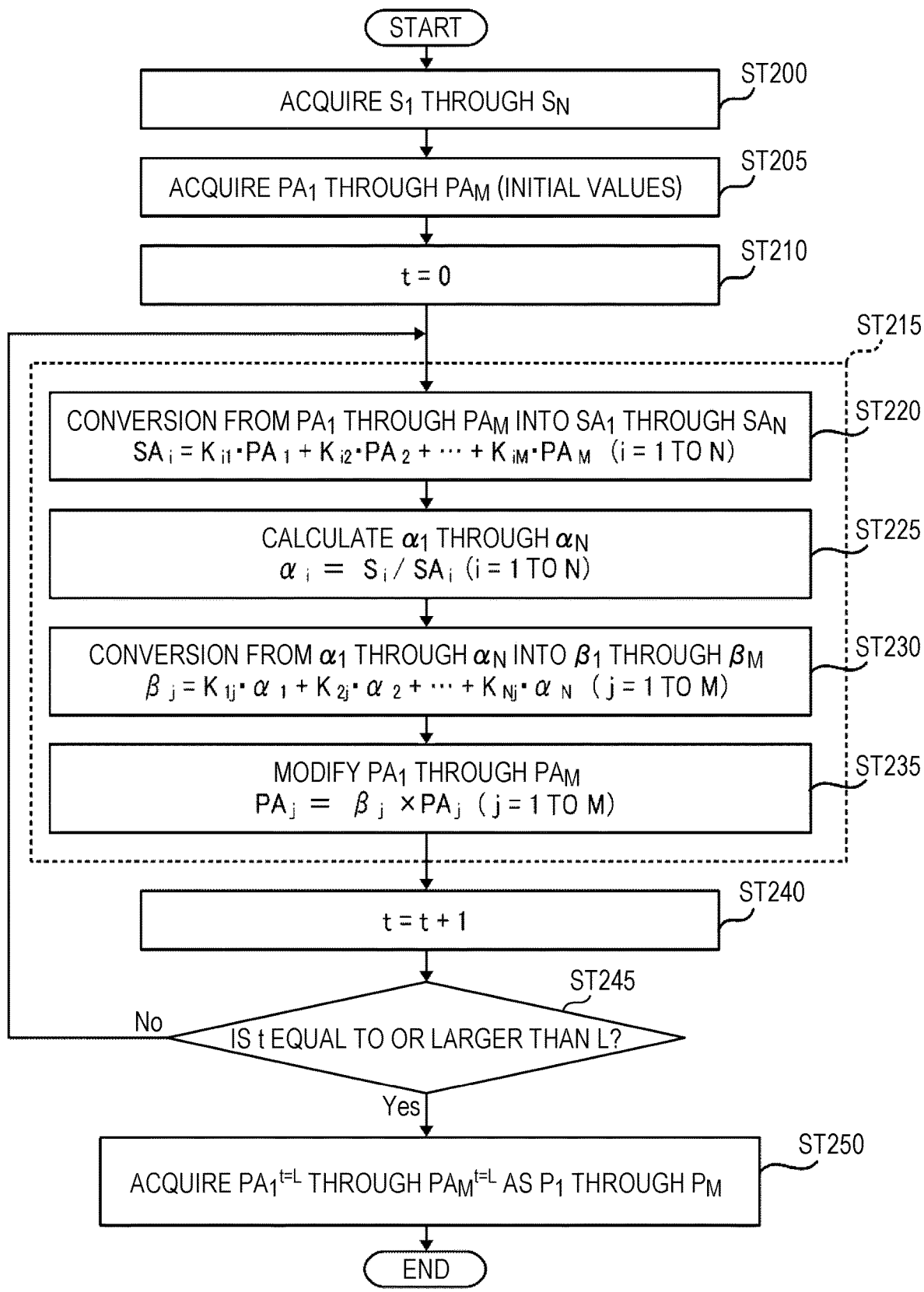
FIG. 32 is a flowchart for explaining processing for configuring M pieces of element data from N pieces of detection data.
Figure 33A:
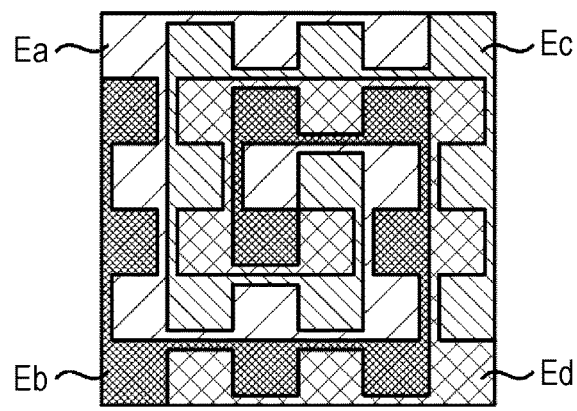
FIGS. 33A and 33B illustrate an example of a structure of a capacitive sensor.
Figure 33B:
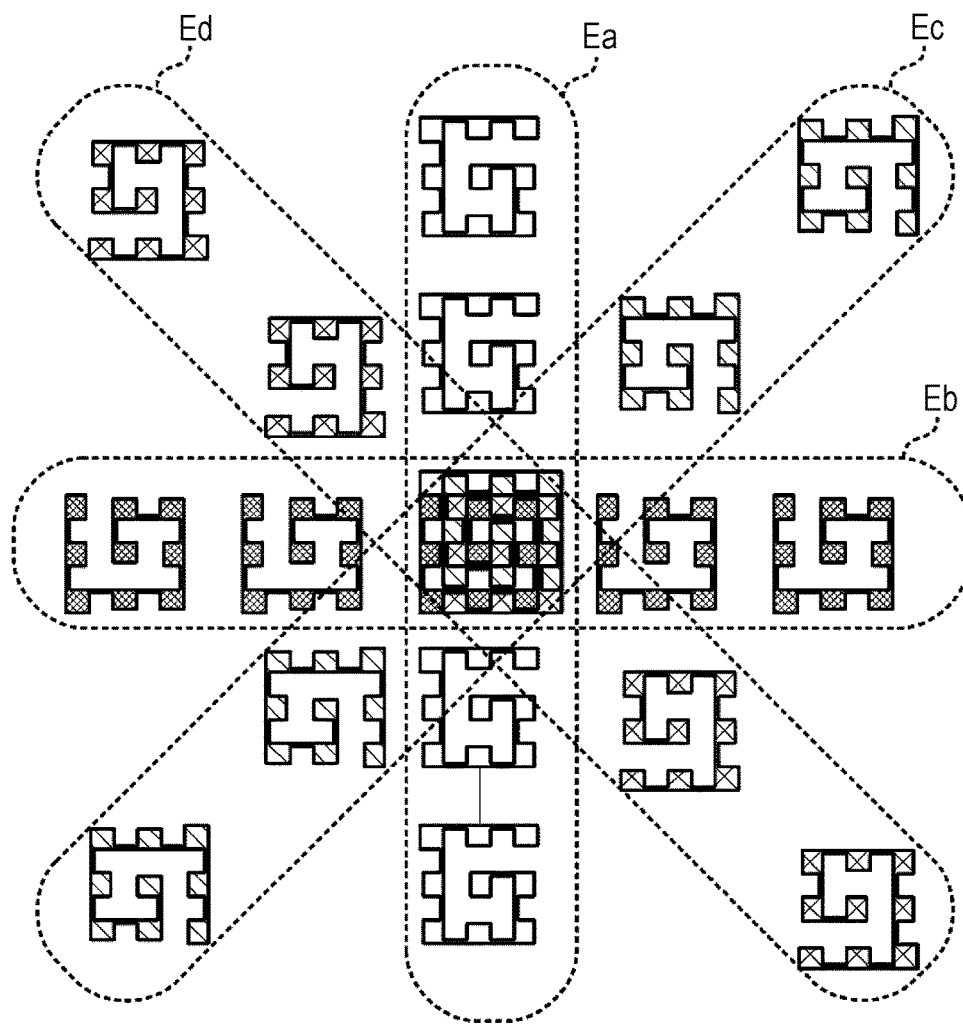

Element data configuring processing is described with reference to the flowchart of FIG. 32.

ST200:

The processing unit 20 acquires N pieces of detection data $S_1$ through $S_N$ generated in the sensor unit 10.

The ST205:

The processing unit 20 acquires initial values of assumed values $PA_1$ through $PA_M$ of element data used for the first time in a repeated loop of data configuring processing (ST215) that will be described later. For example, the element data configuring unit 22 acquires, as the initial values, constant data stored in the storage unit 30 in advance.

ST210:

The processing unit 20 sets a variable t indicative of the number of repetitions of the data configuring processing (ST215) to an initial value "0".

ST215:

The processing unit 20 performs the data configuring processing including four kinds of processing (the first through fourth processing).

First, in the first processing (ST220), the processing unit 20 calculates assumed values $SA'_1$ through $SA'_N$ of N pieces of detection data according to the formula (6) on the basis of the assumed values $PA'_1$ through $PA'_M$ of the M pieces of element data and the first conversion matrix K.

Next, in the second processing (ST225), the processing unit 20 calculates N first coefficients $\alpha_1$ through $\alpha_N$ according to the formula (8) on the basis of the assumed values $SA_1$ through $SA_N$ of the N pieces of detection data and the N pieces of detection data $S_1$ through $S_N$.

Next, in the third processing (ST230), the processing unit 20 calculates M second coefficients $\beta_1$ through $\beta_M$ according to the formula (10) on the basis of the N first coefficients $\alpha_1$ through $\alpha_N$ and the second conversion matrix $K^T$.

Next, in the fourth processing (ST235), the processing unit 20 modifies each of the assumed values $PA_1$ through $PA_M$ of the M pieces of element data according to the formula (12) using the second coefficients $\beta_1$ through $\beta_M$.

ST240:

The processing unit 20 increments the variable t by 1 every time the data configuring processing (ST215) is executed one time.

ST245:

The processing unit 20 executes the data configuring processing (ST215) again in a case where the variable t indicative of the number of times of execution of the data configuring processing (ST215) has not reached L, and shifts to next step ST250 in a case where the variable t has reached L.

ST250:

The processing unit 20 acquires, as configuration results of the element data $P_1$ through $P_M$, assumed values $PA_j$ of element data obtained by repetition of the data configuring processing (ST215).

As described above, according to the input device according to the present embodiment, the partial electrodes B of a plurality of detection electrodes E are disposed in each of the M sections $A_1$ through $A_M$ that divide the operation surface 11, and one or more pieces of detection data S are generated for each of the detection electrodes E in the sensor unit 10.

Accordingly, detection data S indicative of a degree of proximity of an object is generated for each of the M sections $A_1$ through $A_M$.

Furthermore, each of the M pieces of element data $P_1$ through $P_M$ is a sum of partial element data $U_{ij}$ (the formula (1)) distributed to the N pieces of detection data $S_1$ through $S_N$ at predetermined proportions (the constant data $K_{ij}$, the formula (3)), and each of the N pieces of detection data $S_1$ through $S_N$ is approximate to a sum of partial element data $U_{ij}$ (the formula (2)) distributed from the M pieces of element data $P_1$ through $P_M$ at predetermined proportions (the constant data $K_{ij}$). That is, conversion from the M pieces of element data $P_1$ through $P_M$ into N pieces of detection data $S_1$ through $S_N$ is defined by N pieces of constant data $K_{ij}$ set for each of the M pieces of element data $P_1$ through $P_M$ (the formula (5)).

In the data configuring processing of the element data configuring unit 22, each of assumed values $SA_1$ through $SA_N$ of N pieces of detection data is calculated as a sum of partial element data $U_{ij}$ distributed from each of assumed values $PA_1$ through $PA_M$ of M pieces of element data at predetermined proportions (the constant data $K_{ij}$) (the formula (6)). Furthermore, the assumed values $PA_1$ through $PA_M$ of the M pieces of element data are modified on the basis of M×N pieces of constant data $K_{ij}$ so that the calculated assumed values $SA_1$ through $SA_N$ of the N pieces of detection data approach the N pieces of detection data $S_1$ through $S_N$. By repeating the data configuring processing a predetermined number of times, convergent values of the M pieces of element data that match the N pieces of detection data $S_1$ through $S_N$ can be obtained.

The present invention is not limited to the above embodiments only and encompasses various variations that can be easily arrived at by a person skilled in the art.

In the drawings of the embodiments above, a wide gap is provided between partial electrode groups so that wiring can be easily seen, but the width of this gap is arbitrary, and partial electrode groups may be disposed closer to each other. Note that wiring in a first layer and a partial electrode that are connected to each other may be patterned as an integral member. Furthermore, partial electrodes in adjacent sections that are connected to each other may be patterned as an integral member.

The configurations and layouts of detection electrodes, the shapes and wiring patterns of partial electrodes, and the like described in the above embodiments are merely examples, and the present invention is not limited to these examples.

What is claimed is:

1. A capacitive sensor for detecting a change in electrostatic capacitance caused by a change in position of an object in each of a plurality of sections that divide a region to which the object is approachable, comprising:
   a plurality of detection electrodes each including a plurality of partial electrodes connected in cascade via wiring;
   a first layer in which the partial electrodes and the wiring are disposed; and
   a second layer in which the wiring is disposed,
   wherein each of the plurality of detection electrodes belongs to any one of three or more detection electrode groups,
   the detection electrodes that belong to a same one of the detection electrode groups among the plurality of detection electrodes do not intersect one another,
   the detection electrodes that belong to different ones of the detection electrode groups among the plurality of detection electrodes intersect one another while being in the first layer and the second layer, respectively,
   three or more partial electrodes included in three or more different ones of the detection electrodes belonging to different ones of the detection electrode groups are located in each of the plurality of sections,
   the three or more detection electrodes belonging to the different ones of the detection electrode groups intersect one another in an inner one of the sections surrounded by other sections,
   the three or more partial electrodes located in the inner section include a single first partial electrode and at least two second partial electrodes,
   the first partial electrode is connected in cascade to the partial electrode on one side via the wiring passing through the first layer or the second layer and is connected in cascade to the partial electrode on the other side via the wiring passing through the second layer, and
   each of the second partial electrodes is connected in cascade to the partial electrode on one side via the wiring passing through the first layer and is connected in cascade to the partial electrode on the other side via the wiring passing through the second layer.

2. The capacitive sensor according to claim 1, wherein the first partial electrode is connected in cascade to the partial electrode on one side via the wiring passing through the first layer and is connected in cascade to the partial electrode on the other side via the wiring passing through the second layer.

3. The capacitive sensor according to claim 1, wherein the first partial electrode is connected in cascade to the partial electrode on one side via the wiring passing through the second layer and is connected in cascade to the partial electrode on the other side via the wiring passing through the second layer.

4. The capacitive sensor according to claim 1, wherein the three or more partial electrodes located in the inner section include a single third partial electrode; and the third partial electrode is connected in cascade to the partial electrode on one side via the wiring passing through the first layer and is connected in cascade to the partial electrode on the other side via the wiring passing through the first layer.

5. The capacitive sensor according to claim 1, wherein at least one pair of the partial electrodes located in a same one of the sections have shapes that are rotationally symmetric with each other about a central point of the section.

6. The capacitive sensor according to claim 5, wherein at least one pair of the partial electrodes located in a same one of the sections have shapes that are two-fold symmetric with each other about a central point of the section.

7. An input device for inputting information according to a change in electrostatic capacitance caused by a change in position of an object in each of a plurality of sections that divide a region to which the object is approachable, comprising:
   the capacitive sensor according to claim 1;
   an electrostatic capacitance detection unit; and
   an element data configuring unit.

8. A capacitive sensor for detecting a change in electrostatic capacitance caused by a change in position of an object in each of a plurality of sections that divide a region to which the object is approachable, comprising:

a plurality of detection electrodes each including a plurality of partial electrodes connected in cascade via wiring;
a first layer in which the partial electrodes and the wiring are disposed; and
a second layer in which the wiring is disposed,
wherein each of the plurality of detection electrodes belongs to any one of three or more detection electrode groups,
the detection electrodes that belong to a same one of the detection electrode groups among the plurality of detection electrodes do not intersect one another,
the detection electrodes that belong to different ones of the detection electrode groups among the plurality of detection electrodes intersect one another while being in the first layer and the second layer, respectively,
three or more partial electrodes included in three or more different ones of the detection electrodes belonging to different ones of the detection electrode groups are located in each of the plurality of sections,
the three or more detection electrodes belonging to the different ones of the detection electrode groups intersect one another in an inner one of the sections surrounded by other sections,
the three or more partial electrodes located in the inner section include a single first partial electrode and at least two second partial electrodes,
the first partial electrode is connected in cascade to the partial electrode on one side via the wiring passing through the first layer or the second layer and is connected in cascade to the partial electrode on the other side via the wiring passing through the second layer,
each of the second partial electrodes is connected in cascade to the partial electrode on one side via the wiring passing through the first layer and is connected in cascade to the partial electrode on the other side via the wiring passing through the second layer, and wherein
the capacitive sensor includes N detection electrodes as the plurality of detection electrodes;
the electrostatic capacitance detection unit generates, for each of the N detection electrodes, detection data corresponding to first electrostatic capacitance between the object and the detection electrode;
the element data configuring unit configures M pieces of element data indicative of degrees of proximity of the object in the respective M sections on a basis of the N pieces of detection data, M being a natural number larger than N;
each of the M pieces of element data is a sum of partial element data distributed to the respective N pieces of detection data at predetermined proportions;
each of the N pieces of detection data is approximate to a sum of the partial element data distributed from the M pieces of element data at the predetermined proportions;
each of the partial element data is approximate to second electrostatic capacitance between one of the partial electrodes and the object in one of the sections;
each of the element data is approximate to third electrostatic capacitance obtained by summing up all second electrostatic capacitances in one of the sections;
the element data configuring unit repeats data configuring processing for calculating assumed values of the N pieces of detection data as sums of the partial element data distributed from assumed values of the M pieces of element data at the predetermined proportions and modifying the assumed values of the M pieces of element data on a basis of the N predetermined proportions set for each of the M pieces of element data so that the calculated assumed values of the N pieces of detection data approach the N pieces of detection data.

9. The capacitive sensor according to claim 8, wherein the first partial electrode is connected in cascade to the partial electrode on one side via the wiring passing through the first layer and is connected in cascade to the partial electrode on the other side via the wiring passing through the second layer.

10. The capacitive sensor according to claim 8, wherein the first partial electrode is connected in cascade to the partial electrode on one side via the wiring passing through the second layer and is connected in cascade to the partial electrode on the other side via the wiring passing through the second layer.

11. The capacitive sensor according to claim 8, wherein the three or more partial electrodes located in the inner section include a single third partial electrode; and
the third partial electrode is connected in cascade to the partial electrode on one side via the wiring passing through the first layer and is connected in cascade to the partial electrode on the other side via the wiring passing through the first layer.

12. The capacitive sensor according to claim 8, wherein at least one pair of the partial electrodes located in a same one of the sections have shapes that are rotationally symmetric with each other about a central point of the section.

13. The capacitive sensor according to claim 12, wherein at least one pair of the partial electrodes located in a same one of the sections have shapes that are two-fold symmetric with each other about a central point of the section.

14. An input device for inputting information according to a change in electrostatic capacitance caused by a change in position of an object in each of a plurality of sections that divide a region to which the object is approachable, comprising:
the capacitive sensor according to claim 8;
an electrostatic capacitance detection unit; and
an element data configuring unit.

* * * * *